(12) United States Patent
Hooley et al.

(10) Patent No.: US 6,833,656 B2
(45) Date of Patent: Dec. 21, 2004

(54) ELECTRO ACTIVE DEVICES

(75) Inventors: Anthony Hooley, Cambridge (GB); David Henry Pearce, Birmingham (GB); Ursula Ruth Lenel, Herfordshire (GB); Gareth McKevitt, Cambridge (GB); Mark Richard Shepherd, Herfordshire (GB)

(73) Assignee: 1 . . . Limited, Cambridge (GB)

( * ) Notice: Subject to any disclaimer, the term of this patent is extended or adjusted under 35 U.S.C. 154(b) by 90 days.

(21) Appl. No.: 10/168,730

(22) PCT Filed: Dec. 21, 2000

(86) PCT No.: PCT/GB00/04949

§ 371 (c)(1),
(2), (4) Date: Oct. 10, 2002

(87) PCT Pub. No.: WO01/47041

PCT Pub. Date: Jun. 28, 2001

(65) Prior Publication Data

US 2004/0017129 A1 Jan. 29, 2004

(30) Foreign Application Priority Data

Dec. 21, 1999 (GB) .............................................. 9930010
Feb. 14, 2000 (GB) .............................................. 0003136
Aug. 24, 2000 (GB) ............................................. 0020941

(51) Int. Cl.$^7$ .............................................. H01L 41/08
(52) U.S. Cl. ...................... 310/369; 310/328; 310/339; 310/800
(58) Field of Search ........................ 310/311, 328–332, 310/339, 367, 369, 800

(56) References Cited

U.S. PATENT DOCUMENTS 3,781,955 A * 1/1974 Lavrinenko et al. ........ 29/25.35
3,816,774 A * 6/1974 Ohnuki et al. .............. 310/332

(List continued on next page.)

FOREIGN PATENT DOCUMENTS

| DE | 1 945 448 | 3/1971 |
| EP | 0 251 901 | 1/1988 |

(List continued on next page.)

OTHER PUBLICATIONS

Dancila, D.S. et al; Large Displacement Piezoelectric Actuator Configurations; Adaptive Structures and Material Systems; Nov. 15–20, 1998; pp. 83–87; XP001004521, ASME, New York, New York, NY.

(List continued on next page.)

*Primary Examiner*—Mark Budd
(74) *Attorney, Agent, or Firm*—Gerry J. Elman; Elman Technology Law, P.C.

(57) ABSTRACT

The present invention relates to an electro-active device having an electro-active structure extending along a minor axis (36) which is curved, for example in a helix around a major axis (37). The electro-active structure comprises successive electro-active portions (35) extending around said minor axis and arranged with electrodes to bend, when activated, around the minor axis (36) such that bending of the successive portions (35) is concomitant with rotation of the electro-active structure about the minor axis (36) adding incrementally along the minor axis (36). The electro-active structure generates displacement out of the local plane in which the minor axis is curved. The electra-active structure may be continuous electro-active member (35) extending along and curving around the minor axis (35), for example helically to form a helical helix. Alternatively, the electro-active structure may be a plurality of discrete elements (211) connected together. The electro-active portions preferably have a bender structure formed from a plurality of layers. The device may be used as a driver, a sensor or a generator.

70 Claims, 16 Drawing Sheets

U.S. PATENT DOCUMENTS

| | | | | |
|---|---|---|---|---|
| 3,900,748 A | * | 8/1975 | Adler | 310/333 |
| 4,330,730 A | * | 5/1982 | Kurz et al. | 310/331 |
| 4,435,667 A | * | 3/1984 | Kolm et al. | 310/367 |
| 4,601,539 A | | 7/1986 | Watanabe | 350/225 |
| 4,638,207 A | | 1/1987 | Radice | 310/328 |
| 4,695,988 A | * | 9/1987 | Banno | 367/154 |
| 5,440,194 A | | 8/1995 | Beurrier | 310/328 |
| 5,526,601 A | * | 6/1996 | Onuma et al. | 43/17 |
| 5,559,387 A | * | 9/1996 | Beurrier | 310/328 |

FOREIGN PATENT DOCUMENTS

| | | |
|---|---|---|
| GB | 2 322 232 | 8/1998 |
| GB | 2 329 514 A | 3/1999 |
| JP | 11064096 | 3/1999 |
| WO | WO 98/09339 | 3/1998 |
| WO | WO 98/34434 | 8/1998 |
| WO | WO 99/54626 | 10/1999 |

OTHER PUBLICATIONS

B.L. Jiao & J.D. Zhang; Torsional Modes in Piezo Helical Springs; IEEE Transactions on Ultrasonics, Ferroelectronics, and Frequency Control; vol. 46, No. 1, Jan. 1999.

* cited by examiner

Fig.41.
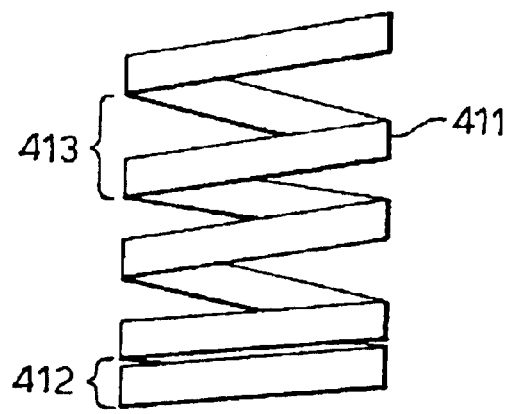
Fig.42.
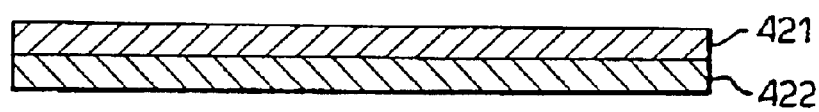
Fig.43.
Fig.44.
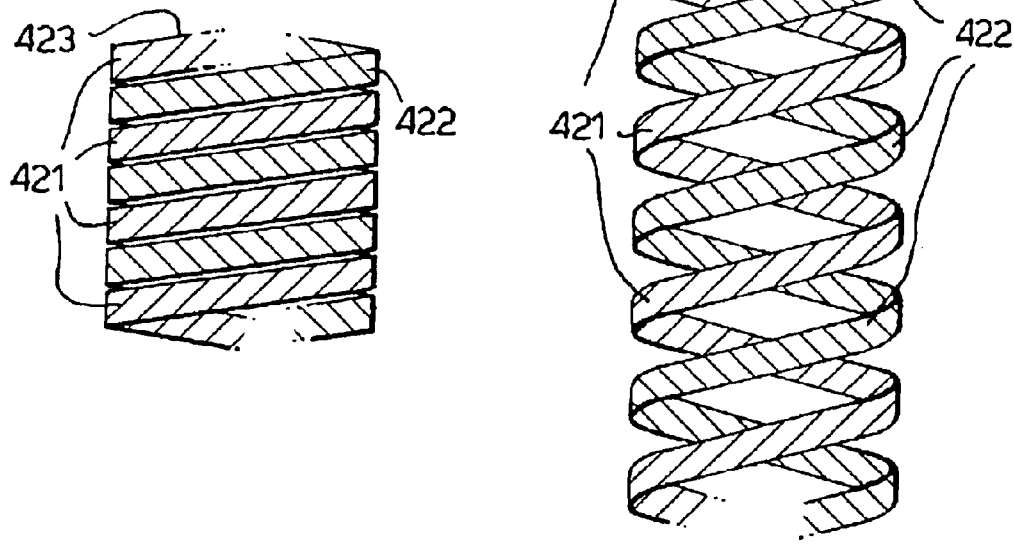

ELECTRO ACTIVE DEVICES

This invention relates to electro-active devices, and uses therefor. More particularly, the invention concerns novel constructions of electro-active (such as piezoelectric and piezoresistive) devices, some with integral positioning and control mechanisms. The electro-active devices may be used as electromechanical drivers, sensors or generators.

Electro-active devices are those which make use of components that display electro-active properties—that is, those in which a component changes shape in response to a change of the appropriate electrical conditions in which the component exists. Equally, of course, the component may produce electrical signals in response to a shape change. The best known, and most developed, of these devices are piezoelectric devices. However, it will be understood that there are a number of other sorts of electro-active device, including those that are electrostrictive (made from a material which contracts on the application of an electric field) or piezoresistive (this latter group being those the electrical resistance of which changes as they change shape). The devices of the invention include those with components that display effects based on such other types of electro-activity.

Early piezoelectric devices, and indeed many in use today, were merely simple blocks of piezoelectric material. If compressed in some direction they produce a voltage across opposite faces in a relevant direction; if, alternatively, a voltage is applied across them then they very slightly change their dimensions—typically by considerably less than a micron ($1\times10^{-6}$ m).

Devices operating in this manner have found considerable use in various fields. However, there are many occasions when it is desirable for the application of an electric voltage to produce a much greater change in dimensions, of the order of several millimetres, and vice versa. Attempts to achieve this have focussed on a type of device known as a "bender".

A bender is a construction of piezoelectric device wherein the piezoelectric material is physically in the form of an elongate but relatively thin bar, rather like a ruler, with its associated electrodes along the surface of the bar, and this operating bar is fixedly attached, face to face, onto a substrate in the form of a like bar (which may itself be either of a piezoelectric material or of a non-piezoelectric material). For example, FIGS. 1 and 2 show a known piezoelectric unimorph bender. The bender comprises a flat, uniform layer of active piezoelectric material 1 (shown hatched) bonded face-to-face to a like flat, uniform layer of inactive non-piezoelectric material 2 (shown plain).

When an appropriate electric field is applied across the piezoelectric layer 1 by means of suitably-placed electrodes (not shown, but on either main face of the piezoelectric layer 1), the dimensions of the layer 1 change. In particular, the layer lengthens very slightly. The substrate bar is left undisturbed and so its length is unchanged, or perhaps is made to change in the opposite sense, a bimorph. Expansion of the piezoelectric material, coupled with the restriction placed on it by the unchanged inactive layer 2, causes significant bending of the entire bar in a direction normal to the plane of the bar, as shown in FIG. 2. The movement of one end of the bar relative to the other may be considerable even though the length change is small; it may be many times the length change. For example, using a dual-bar structure 5 cm long, a length change of a fraction of a micron may manifest itself as a tip movement of up to 0.1 mm, or as much as a hundred times the length change. However, the path of the displacement is not linear, because the tip of the device follows a curved path in space.

As already described, on activation a plane bender bends forming a curve which can be described by a radius of curvature and the angle subtended by the ends of the bender. The average length of a bimorph bender does not change, as one part extends while the other part contracts, leaving a neutral axis along the central part of the bender which is the same length as in the inactivated state curved benders are also known, and are typified by that type known as a 'Rainbow'. They are shaped such that the thickness of the device is radial, the bender tape being curved about an axis parallel to its width direction. Such a curved bender also bends on activation. The curve becomes tighter, which is equivalent to a smaller radius of curvature, while the subtended angle increases. Further, if the curvature of such a curved bender is circular (that is, the inactivated bender is in the shape of a circle or an arc of a circle), then on activation it bends to give a larger arc of a circle of smaller radius; the angle subtended increases. The radial change is small (microns for radii of curvature of millimetres or centimetres), and independent of bender length. The angle change, however, increases as the bender length increases, and can be quite significant. Thus, if one end of the bender is fixed, the apparent motion of the other end is primarily a rotation. For a circular bender of radius a few centimetres, this rotation may be about one degree or so.

In an extension of this circular geometry, helical benders are also known. In these, the bender is in the shape of a helix, rather like a strip of paper flat-wound around and along a cylinder (a tape-wound helix). As with the circular geometry bender, there is a small radial change, independent of tape length. And also as with the circular geometry case, there is with the helical case a rotational displacement about the axis of the helix, but with a helix the relative displacement of the ends follows a helical, rather than circular, path. There is thus also a small change in the axial length of the helix, dependent on the helix pitch angle. The amount of rotation and hence axial length change increases with bender length, resulting in quite significant rotations and axial displacements in long tape-wound helices. For instance, in a helix with a diameter of about 1 cm, an axial length of several centimetres, and having several helical turns of a bender tape several millimetres wide, the radial change is of the order of microns while the axial length change may be around 1 mm and the rotation may be several degrees.

It would be desirable to provide an electro-active device having a form which allows for large displacement relative to the size and/or weight of the device.

It would further be desirable to provide an electro-active device having a form which provides displacement which is linear in space, or can follow a path which is selectable by design of the device.

According to the present invention, there is provided an electro-active device having an electro-active structure extending along a minor axis which is curved with a total curvature of at least 30°, the electro-active structure comprising successive electro-active portions extending around said minor axis and arranged with electrodes to bend, when activated, around the minor axis such that bending of the successive portions is concomitant with rotation of the electro-active structure about the minor axis adding incrementally along the minor axis.

Such an electro-active device on activation is displaced out of the plane of the curve. On mechanical activation, the displacement creates an electrical signal on the electrodes, and vice versa on electrical activation. The displacement of the electro-active structure is concomitant with the rotation of the structure and can be understood as follows.

The displacement derives from (a) rotation of the structure around the minor axis and (b) the curve of the minor axis along which the structure extends (hereinafter called the major curve, for ease of reference).

The rotation occurs as follows. Because the successive electro-active portions bend around the minor axis, bending of each portion relatively rotates the adjacent portions around the minor axis. In this way bending of the electro-active portions is converted into rotation of the structure as a whole around the minor axis and vice versa. The rotation adds incrementally along the length of the minor axis. Accordingly there is a net relative rotation between the ends of the structure. When electrically activated an electrical signal applied to the electrodes causes such rotation. In the converse mode of operation when mechanically activated, such rotation generates an electrical signal on the electrodes.

Now consider a small section of the structure along the minor axis. As described above, bending of the portions within the section causes rotation of the structure within the section about the minor axis. The section is curved. As a general point, it will be understood that internal rotation of a curved object creates movement of the object out of the plane of its curve. In the present structure, the rotation within the individual section around the minor axis causes the section to move out of the plane of the curve. This may be visualised as the rotation in the given section displacing adjacent sections because those adjacent sections extend at a slight angle to the given section due to the curve. This is equivalent to an extension or contraction of that section along the direction out of the plane of the curve. It is also equivalent to a change in orientation of the section, that is from an orientation in the plane of the curve to an orientation at an angle to the plane of the curve. In fact, the amount of displacement will be proportional to the degree of rotation within the section and the degree of curvature of the section.

When electrically activated, the net displacement is a summation of the displacements of all the sections of electro-active structure. Vice versa, in the converse mode of operation when mechanically activated, the overall displacement of the structure creates rotation along the minor axis of the structure. In one mode of operation electrical activation generates a rotation of the structure which generates out-of-plane displacement of the structure, or vice versa in a converse mode of operation mechanical activation by out-of-plane displacement generates rotation of the structure which generates an electrical signal on the electrodes.

The displacement is most easily visualised where the minor axis is curved in a regular curve around a geometrical major axis. Such a major curve may be a helix, spiral or an arc of a circle. Rotation of each section causes relative displacement of the ends of that section along the major axis. Therefore, the overall displacement is extension or contraction of the structure parallel to the major axis. However, displacement is achieved by any curve, so the major curve may be of any shape. To achieve a significant effect on activation, the major curve has a total curvature of at least 30°, most preferably at least 90°.

Such an electro-active device can provide a large displacement compared to known devices. As a considerable total rotation may be achieved along the length of the minor axis, a correspondingly large displacement may be achieved along the major axis. The amount of extension is proportional to overall length and size of the device. Therefore by appropriate sizing of the device, it is possible to achieve large displacements beyond levels achievable by known benders.

In fact, the displacement of an electro-active structure in accordance with the present invention is quite striking to watch. Millimetres or even centimetres of displacement can be achieved. For example, a structure formed from a 0.5 mm thickness tape wound as a 4 mm diameter minor helix around the minor axis which minor helix itself curves around a major curve which is a segment of about three quarters of a circle of 30 mm diameter has been observed to produce displacement of about ±6 mm. Similarly a structure in which the major curve is a 20 turn helix of diameter 30 mm would produce displacement of around ±120 mm. The rotation of the structure around the minor axis is barely visible, but the net effect is a considerable displacement.

The displacement may be controlled by appropriate design of the electro-active structure. For example, a regular structure along the length of the minor axis provides a displacement which is linear in space. This is highly desirable in many applications. In contrast, variation in the structure along the length of the minor axis and/or the shaping of the device to curve around a non-linear major axis allows the path of the displacement to be controlled.

In the general case where either or both the structure along the minor axis or the major curve is not regular, the out-of-plane displacement on activation is generally non-linear. Large displacements in any desired direction or following any desired path can thus be obtained by careful selection of the geometry.

If an electro-active material is used which has a linear field-strain characteristic, then the device will have a linear field-displacement response.

Preferably, the electro-active portions have a bender construction, that is formed from a plurality of electro-active layers, at least one of which is electro-active material. The other layers may be non-active to form a unimorph construction or electro-active to form a bimorph or multimorph construction. The layers will be provided with electrodes arranged for activation of the layers. In general, the layers will be at successive radial positions relative to the minor axis so that bending on activation occurs around the minor axis. Such a bender construction creates a large degree of bending around the minor axis which maximises the net rotation and hence the displacement for a given applied voltage, or vice versa. As the structure is compliant and all the electro-active material can be fully utilised, it produces a large displacement for a given size of device.

A preferable form for the electro-active structure is a continuous electro-active member, such as a tape, which extends along and curves around the minor axis. This form of electro-active structure is particularly easy to manufacture. For example, it may be formed by winding a deformable, continuous electro-active member into the structure.

Preferably, the continuous electro-active member extends as a helix around the minor axis as this is easy to form and maximises efficiency of the device in converting bending to displacement, or vice versa. With a helix it is easy to form a regular structure along the length of the minor axis or to introduce a variation along the length of the minor axis to modify the movement of the device. In general many shapes will provide the necessary rotation around the minor axis, and the turns of the winding may vary in shape, diameter and spacing (in this case the term 'axis' refers to the macroscopic approximate centre line of the winding; the local axis of curvature and radius of curvature vary along the minor axis).

It is also easy to envisage the operation of the device when formed as a helical tape or other continuous member. In this case, bending of the tape can clearly be understood to cause a rotation of the structure as a whole around the minor axis. Furthermore, when the major curve around the major axis is considered, it is easy to visualise the displacement of one end of the helical tape relative to the other end caused by the rotation. For example, where the minor curve extends in a circle or arc of a circle arranged horizontally, if one end is fixed, then on activation in the correct sense, the other end rises vertically, as do all points in between, the amount of vertical displacement rising progressively towards the free end. There is a sideways displacement of the minor axis along which the structure extends manifesting itself as a change in orientation of the minor axis. However, it will be apparent that other structures within the scope of the present invention cause a similar effect.

An alternative form for the electro-active structure is a plurality of discrete electro-active elements connected together. The discrete elements may be separately formed and connected by separate connecting elements. This is particularly advantageous because it allows the mechanical response of the device to be controlled by appropriate selection of the form and material of the connecting element. This means that the desired mechanical response does not restrict the choice of electro-active material.

Alternatively, the elements and connecting portions may be formed from a unitary elongate member.

A device in accordance with the present invention has many uses. It may be used as a driver to convert a signal applied to the electrodes of the electro-active device into relative movement along the major axis. If mounted such that one end is fixed and the other end free, on activation large displacements of the free end result. If a mechanical load is applied to one end, activation causes a force to be developed acting against that mechanical load, thus forming a linear actuator. If, following electrical activation with a non-zero drive voltage, the terminals are open-circuited, the device will maintain its output force (if the mechanical load is static) for a significant time determined by the internal leakage current of the piezoelectric structure. The device acts mechanically like an elastic coil-spring if not electrically activated.

In the converse mode of operation of the electro-active material, the device may be used as a sensor to convert relative movement along the major axis into a signal on the electrodes of the electro-active device. If the terminals are connected to a high-impedance electrical detector or measurement circuit, and the device is subjected to an external axial force, then it will produce a measurable output voltage proportional to the axial compression or expansion of the device caused by that force. Such devices may be used as a force sensor, or a displacement sensor.

Similarly, the device may be used as a generator to convert relative movement into a voltage on the electrodes of the electro-active device.

The major and minor axes are of course imaginary axes but are useful for visualising and defining the device. In regular geometries the axes may be the geometrical axes of curvature or symmetry, but in general they are any axes about which the structure extends.

Embodiments of the invention are now described by way of non-limitative example with reference to the accompanying drawings in which:

FIGS. 38 to 40 show an electro-active structure in which the major curve is two straight arms with a sharp angle in between;

FIG. 41 show an electro-active structure in which the major curve is a helix which varies in pitch;

FIGS. 42 to 44 show structures formed from two electro-active members;

ELECTRO-ACTIVE MATERIAL

Figure 1:
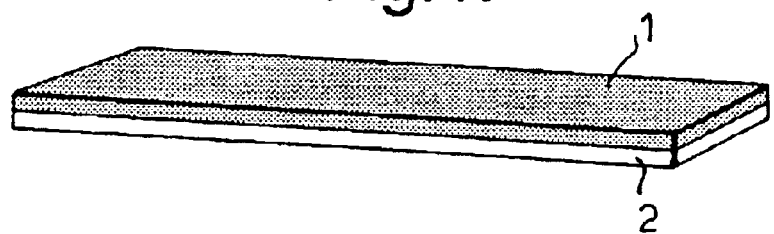
FIGS. 1 & 2 are perspective views from one side of a simple known bar-like piezoelectric bender structure.
Figure 2:
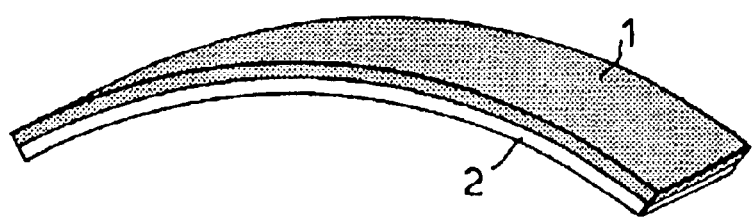

The invention provides a device, which may be a component of a larger device, and which has an electro-active structure. The electro-active structure has electro-active material in which on electrical activation a change in electric conditions (for instance, electrical field) produces a change in dimensions, or vice versa on mechanical activation a dimensional change results in an electrical signal.

The electro-active material of the device of the invention may, for instance, be a piezoelectric or electrostrictive material. On the application of an electric field across a piezoelectric material, it expands or contracts (depending on whether is poled in the same or opposite direction as the electric material) perpendicularly to the electric field. On the application of an electric field across a electrostrictive material, it contracts perpendicularly to the electric field. The electric field may be conveniently applied via a voltage on electrodes on either side of the electro-active material, preferably on its faces.

Further, the electro-active material may be a piezoresistive material, in which the electrical resistance changes as the material is extended or contracted, i.e. strained. In this piezoresistive case, the change of resistance of the layer made of this material can be detected; this may be employed to determine the position of the device, providing a position sensor, or, by further manipulation, a force, velocity or acceleration sensor. A piezoresistive layer does not require face electrodes, but is connected at its ends to an external electrical circuit.

The electro-active portions preferably have a bender construction of a plurality of layers at least one of which is electro-active material. This type of construction is known for planar benders. The electro-active bender construction can have many layers. A construction including one electro-active layer together with a non-active layer, such as inactive ceramic or plastic, is known as a unimorph. On activation, extension or contraction of the active layer causes the device to bend because the face attached to the non-active layer is constrained. A construction including two electro-active layers arranged to be activated in opposite senses is known as a bimorph. On activation, one layer extends and the other contracts, causing the structure to bend because the attached faces of each layer are constrained by each other. Of course, the multilayer construction may have more than two active layers, which is known as a 'multimorph', and may contain plural layers of inactive material.

The layers are provided with electrodes for activation. The positioning of the electrodes depends upon the nature and purpose of the active layers. In the case of piezoelectric devices the electrodes will include conductive activation electrodes arranged on opposite sides of a given layer and extending along the entire length of the layer. Typically the activation electrodes will be formed directly on the faces of the layer they activate, but in some arrangements other layers can be interposed. Some activation electrodes may be used to activate more than one layer. A voltage across a pair of activation electrodes causes the layer between them to extend or contract. The positioning of electrodes and formation of the electro-active layers, for example with appropriate poling to expand or contract in the correct sense, is the same as for known planar benders so is not described in detail.

Figure 3:
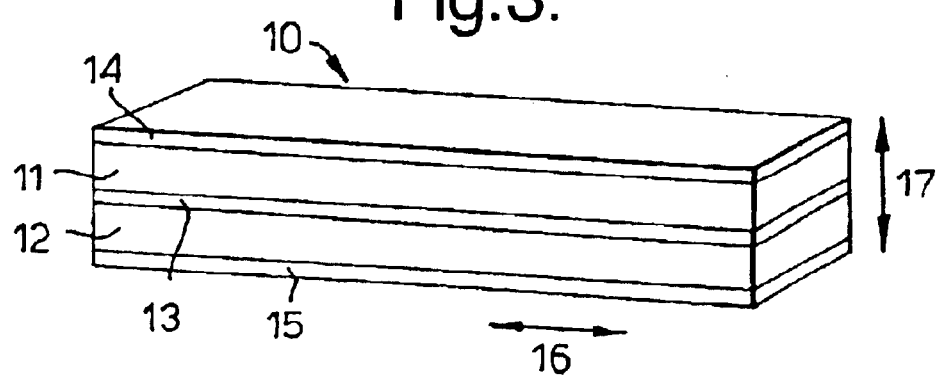
FIG. 3 is a perspective view of an electro-active portion having a bimorph construction.

As an example, FIG. 3 illustrates an electro-active portion 10 having a bi-morph construction and comprising two layers 11, 12 of electro-active material. Three activation electrodes 13, 14, 15 are provided on the faces of the layers 11, 12. In particular a common electrode 13 is provided between the layers 11, 12 and acts as a common activation electrode for both layers 11, 12. The other electrodes 14, 15 are each provided on the opposite side of a respective one of the two layers 11, 12 to act as an activation electrode for that respective layer 11, 12. To act as a bi-morph, the layers 11, 12 may be poled in opposite directions by applying poling voltages to the electrodes 13, 14, 15. In that case the activation voltages are applied or developed in the same direction. Alternatively the layers 11, 12 may be poled in the same direction, in which case the activation voltages are applied or developed in opposite directions. On activation, the two layers 11, 12 expand or contract in opposite senses along the length of the electro-active portion 10 (illustrated by the arrow 16) and the electro-active portion bends perpendicularly (in the direction illustrated by arrow 17).

The material of which the active layers of the device is made may be any of the types of electro-active material discussed above, or indeed any other suitable electro-active material or combinations of different materials, but preferably it is of piezoelectric material with associated electrodes. If an electro-active material is used which has a linear field-strain characteristic, then the device will have a linear field-displacement response. In much of what follows, devices using piezoelectric material are described, but equivalent devices can be manufactured in other electro-active materials.

The piezoelectric material can be any suitable material. A piezoelectric ceramic such as lead zirconate titanate (PZT) is satisfactory, as are other piezoelectric materials, such as polymers like PVDF (polyvinylidenefluoride).

As well as one or more electro-active layers, the structure may include non-active layers, such as inactive ceramic, which may affect the bending properties of the "bender", as in the unimorph type of bender. A similar non-active layer may be incorporated in a multilayer device, modifying the bending properties and enhancing stiffness, and hence force capability, at the expense of displacement. High force, low displacement devices may be used as actuators and positioning devices where the device is required to move another component of non-negligible mass. The inclusion of non-active layers also modifies the resonant frequency of the device, allowing tailoring of the frequency response to the particular application, and may also be chosen to provide a damping effect. Tailored resonant frequencies are important in fast moving reciprocating devices such as, for instance, loudspeakers, disc drives and optical tracking mechanisms.

External material of, say, a polymeric or elastomeric material may be applied to act as a protective and/or shock absorbing layer to prevent damage to the device during handling or operation, or perhaps to provide some modification of the device's damping properties. The external material may be applied as a further layer in a layered electro-active structure or by dipping the device in molten material to embed the device in the material after it sets.

Whilst a layered bender construction is preferred for simplicity and ease of manufacture, the electro-active structure may take other forms and constructions which allow it to bend around the minor axis on activation.

Embodiments Formed From A Continuous Member

In its preferred form, the electro-active structure is formed from a continuous electro-active member, such as an elongate tape. Where a layered construction is used, the dimensions of the member across the member parallel to the layers (hereinafter the width) and across the layers (hereinafter the thickness) may be of any size both in absolute and relative terms. For instance the width may be large relative to the thickness, for instance, 5 to 10 times larger or more. In contrast, the width may be very narrow, comparable to or less than its thickness. In general the thickness is dependent on the number and thickness of the layers used in the construction, and the width may be independently selected to provide the member with sufficient strength and bending force.

Next, is described the way in which the continuous electro-active member is arranged around the minor axis. The continuous electro-active member extends along the minor axis, and as it do so curves around the minor axis. The continuous electro-active member is arranged to bend around the minor axis. Thus adjacent finite portions of the continuous member constitute the successive electro-active portions which extend around and bend around the minor axis.

With a layered construction, the layers face the minor axis positioned at successive radial distances from the minor axis, and are poled to extend or contract along their length so that bending occurs around the minor axis. Therefore the activation electrodes for any given layer will be radially spaced on opposite sides of the given layer.

Figure 4:
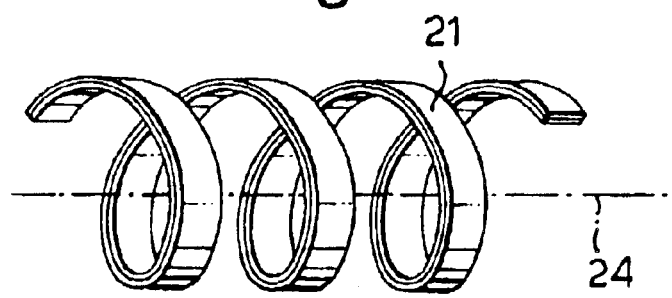
FIG. 4 is a side view of a continuous electro-active member extending in a helix.

The line of the continuous member around the minor axis may be referred to as the minor curve for ease of reference. Preferably, the continuous electro-active member is in the form of a helix extending around and along the minor axis. In the case of a helix it is clear that bending of the member around the minor axis creates rotation of the member around the minor axis, by tightening or loosening of the turns of the helix. This may be described as a "face-wound" or "tape-wound" shape. For example, FIG. 4 shows diagrammatically a flat bi-layer tape 21 extending around a minor axis 24 in a helix to form a helical electro-active structure extending along the minor axis 24.

To achieve a maximum degree of rotation around the minor axis the layers of the continuous electro-active member are oriented so that across the width of the member the layers extend parallel to the minor axis. In other words, when viewed in cross-section taken radially of the minor axis, the layers extend parallel to the minor axis. The tape illustrated in FIG. 4 is in this orientation. In this orientation all the bending is around the minor axis, that is the bending movement is all radial to the minor axis. There is no component of the bending along the minor axis. Therefore all the bending contributes towards rotation of the member around the minor axis, thereby maximising that rotation.

For uniform properties, a regular helix is used. However, there are advantages in the helix being irregular. For example, it might vary in diameter or pitch along its length (like a spiral that has been pulled out, or like a helix that has been pulled longer in some parts; this could result in stronger, stiffer portions and lighter, more delicate, faster-acting portions, as above), and/or it might not be circular (making the helix oval, say, would affect the displacement direction, enabling tailored directional movement). Moreover, it might not be smoothly wound, but instead be angularly, or "jaggedly" wound, with corners, and straight electro-active elements in between like a staircase reaching up from floor to floor. Such an angular winding would allow a greater length of material to be packed into the same space.

Figure 5:
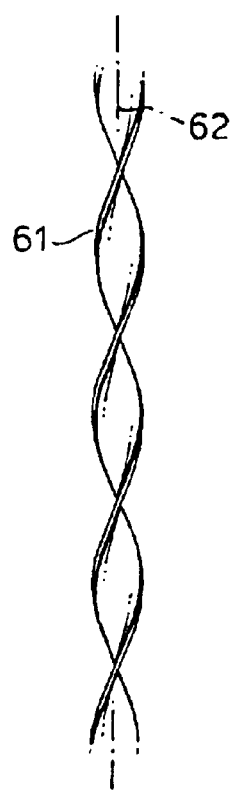
FIGS. 5 and 6 are side views of a continuous electro-active member twisted along its length.
Figure 6:
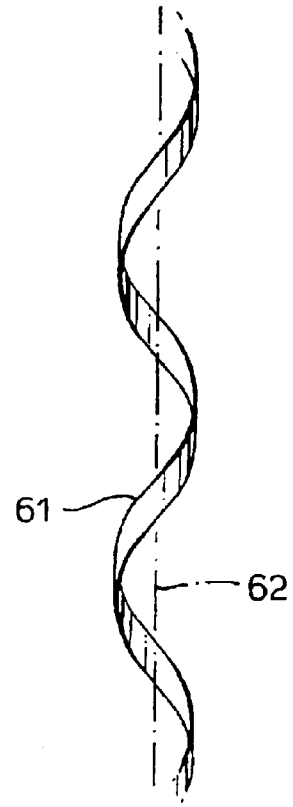

The continuous electro-active member may have geometrical forms other than a helix, indeed any other geometrical form in which some or all of the member bends around the minor axis and causes rotation of the structure as a whole around the minor axis. For example, the continuous member may be a tape having a shape in which it is twisted along its length rather than wound. This can be visualised as being formed, or indeed actually formed by holding one end of a long tape and, keeping the tape "taut", rotating the other end around the axis 62 of the tape, producing a twisted tape. For example, FIGS. 5 and 6 illustrate an electro-active tape 61 formed in such a shape around an axis 62. FIG. 5 illustrates the inactivated form. In this form, the edges of the tape describe helices winding around the central axis, while the centre line (long axis) of the tape remains at the centre, i.e. on the axis, along the whole length of the twisted tape. FIG. 6 illustrates the activated form. When the twisted tape is a piezoelectric bender as already described, activation causes the tape to bend such that the tape moves out from the central axis at all points, that is the centre line now follows a helical path around the long axis and the tape edges follow the path of a helix of greater diameter than that of the non-activated state. Such a twisted tape may be easier to manufacture than a helically-wound tape.

To achieve uniform properties along the structure, the electro-active member may be formed with the same composition, number of layers, and cross-sectional dimensions all along its length. However, for certain uses it may prove useful to have some other cross-section, say, barrelled or waisted and/or to introduce a variation in the number and type of layers, their composition, or the width and thickness along the length of the tape.

Figure 7:
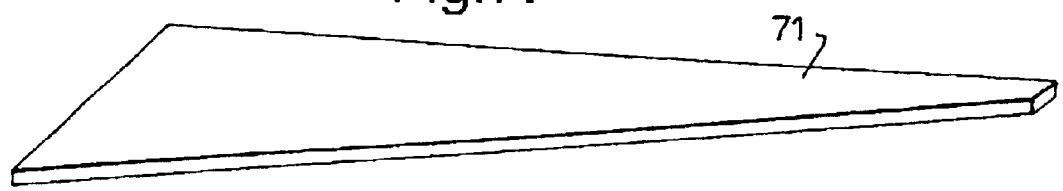
FIGS. 7 and 8 illustrate a continuous electro-active member having a width which varies along its length.
Figure 8:
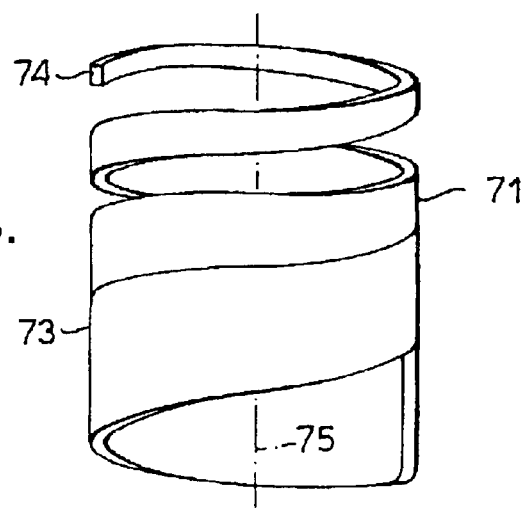

Varying the number and type of layers and their composition along the length of the structure causes a variation in activity along the length, together with a variation in mechanical properties. Likewise, a change in thickness or width varies the activity and stiffness. For example, FIGS. 7 and 8 show an bender tape 71 whose width varies along its length. FIG. 7 shows the tape 71 notionally unwound, while FIG. 8 shows such a tape 71 extending in a helix with constant pitch around a minor axis 75. The tape width at the base of the device 73 is large, while at the tip 74 the tape is narrow.

Figure 9:
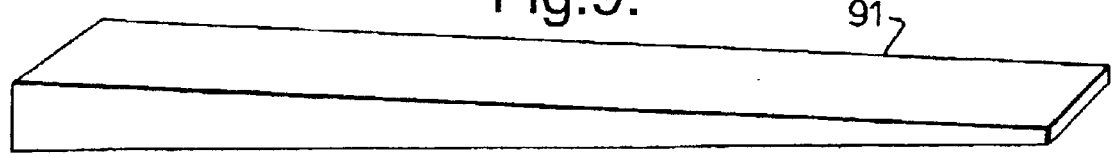
FIGS. 9 to 13 illustrate a continuous electro-active member having a thickness which varies along its length.
Figure 10:
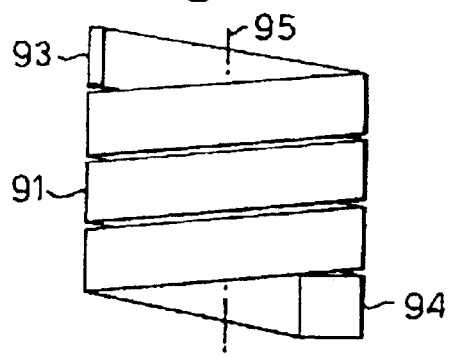
Figure 11:
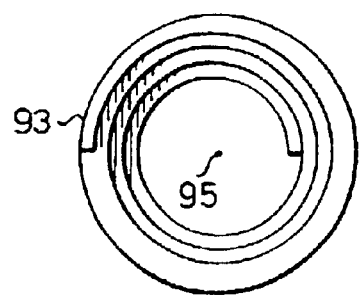
Figure 12:
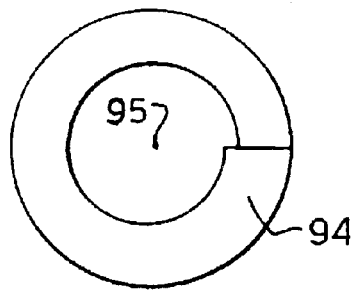
Figure 13:
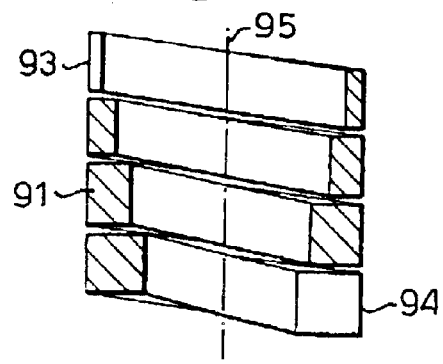

FIGS. 9 to 13 illustrates the use of a bender tape 91 whose thickness varies along its length. FIG. 9 shows the tape 91 notionally unwound, and FIG. 10 shows the tape 91 extending in a helix around a minor axis 95. FIG. 11 shows a bottom plan view at the tip 93 of the helix, and FIG. 12 shows a corresponding top plan view at the base 94 of the helix. A vertical cross-section is shown in FIG. 13, showing the variation in tape width. In such an arrangement, additional electrodes (not shown) can usefully be placed in equispaced layers in the tape to allow a constant activation field throughout the piezoelectric material.

In a simple case, a structure made from a tape which at one end is wider and/or thicker (possibly through having a greater number of layers) than the other end produces a device which is massive and stiff at one end but potentially light-weight at the other. If the massive end is fixed, the relatively massive portion of the device provides a stable and stiff base. Displacements at this end of the device are small on activation, and thus relatively little energy is used moving the heavy portion. The thinner and lighter end, however, may have very significant displacements on activation; the relatively low mass allows fast response, high accelerations, and low energy-loss high frequency movement. Such performance is ideal for devices such as loudspeaker drivers. Furthermore, the resonant frequency of the device may be tailored by selecting appropriate mass and stiffness properties along the device.

Similarly, these parameters of the tape can be varied along its length in any desired manner to provide the properties required at any point in the final device. It may be massive in the centre and light-weight at either end; it may be more massive at the ends than in the centre; or it may vary in a regular or irregular manner.

Embodiments Formed From Discrete Electro-Active Elements

An alternative form for the electro-active structure is as a plurality of discrete electro-active elements connected together. In this case the discrete electro-active elements constitute the electro-active portions which extend around and bend around the minor axis.

The elements are connected to extend around the minor axis and are arranged to bend around that axis. With a layered construction, the layers are positioned at successive radial distances from the minor axis, and are poled to extend or contract along their length so that bending occurs around the minor axis. When activated, bending of each given element around the axis relatively rotates the adjacent elements connected to the given elements around the minor axis. The elements are connected so that the relative rotations add incrementally along the axis to produce a net rotation between the ends of the structure. The electro-active elements may be separately formed and connected together by connecting elements. Alternatively the electro-active elements and connecting portions may be formed together as a unitary member.

One way to connect the electro-active elements is with successive discrete electro-active elements along the minor axis extending from the previous discrete electro-active element in the same sense around the minor axis. Looking at this another way, the angle around the minor axis at which successive connections are positioned progresses in the same sense around the minor axis. As a result, the succession of connected elements form a structure which in effect extends helically around the minor axis. In this case, bending of the successive elements in the same sense around the common axis produces the rotations which add incrementally.

Figure 14:
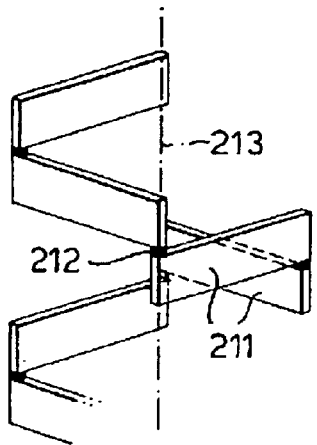
FIG. 14 is a perspective view of a portion of a discrete element structure.
Figure 15:
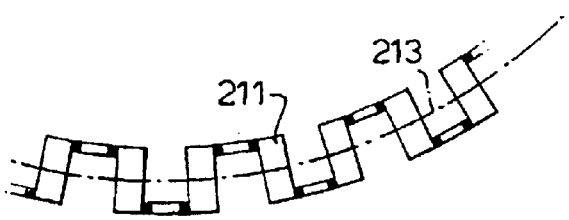
FIG. 15 is a side view of a portion of a discrete element structure.

An example of a portion of such a structure is illustrated in FIG. 14. This structure consists of rectangular electro-active elements 211 which are connected together around a minor axis 213 by connecting elements 212 (described further below). Each electro-active element 211 extends at 90° relative to the adjacent electro-active elements 211, so that the structure has a square cross-section when viewed along the minor axis 213. The connecting elements 212 connect together the corners of successive elements 211. On activation the electro-active elements 211 bend perpendicularly to their faces, hence relatively rotating connected electro-active elements 211 around the axis 213. Successive electro-active elements 211 along the minor axis extending from the previous discrete electro-active element 211 in the same sense around the minor axis 213, the rotation adds incrementally. FIG. 15 shows a portion of the structure extending in a major curve around the major axis 214.

In fact, the structure of electro-active elements may take any form, provided they extend around the common axis. For example, the electro-active portions may be curved around the common axis in their inactivated shape and/or may have shapes or configurations other than rectangular.

Figure 16:
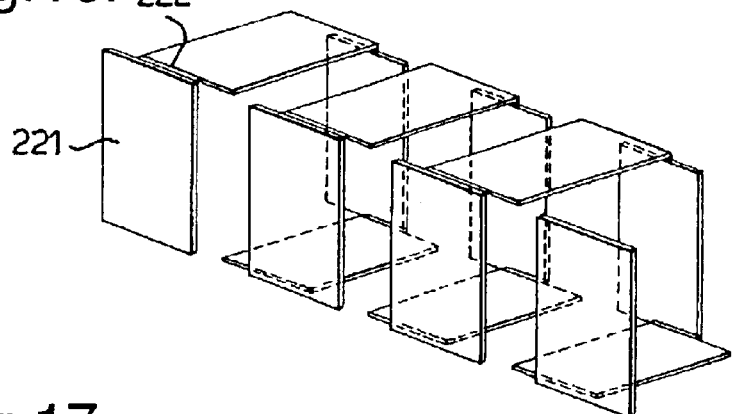
FIG. 16 is a perspective view of a portion of a discrete element structure having an alternative connection configuration.

The electro-active elements may be connected at different positions relative to each element. For example FIG. 16 shows a structure of rectangular electro-active elements 221 which are connected by their end edges 222 which elements 221 overlap at shifted positions relative to one another along the minor axis so that the structure as a whole progresses helically around the axis.

Figure 17:
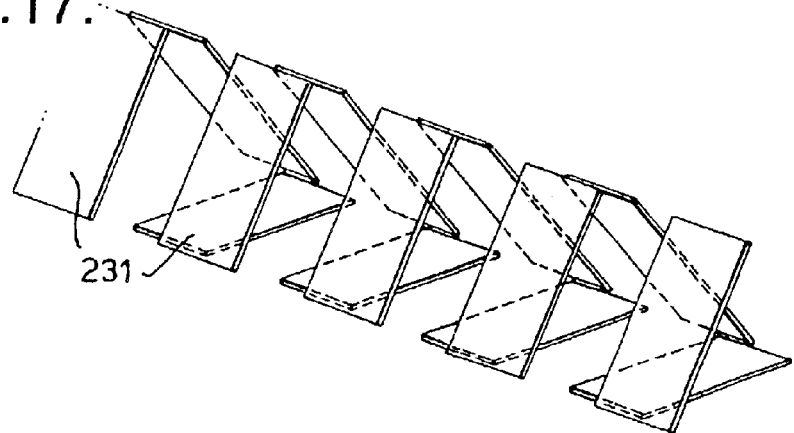
FIG. 17 is a perspective view of discrete element structure having a different cross-section.

The electro-active elements may be connected at any angle relative to each other. FIG. 17 illustrates a structure in which rectangular electro-active elements 231 are connected at 60° relative to each other to form a triangular cross-section when viewed along the minor axis. Any other cross-section could be selected, either regular, such as hexagonal, or irregular. Indeed in general many regular or irregular structures could be formed including structures which are far more complex than those described above.

The connecting elements may take any form provided they connect together the electro-active elements. The connecting elements may be formed from a non-active material which is then fixed to the electro-active elements. In this case, the material of the connecting element may include polymer, ceramic, metal or composite material. The connecting elements may be fixed to the electro-active elements in many ways, for example by an adhesive such as an epoxy or with a resilient fit. The connecting elements may even be simply an amount of adhesive.

Figure 18:
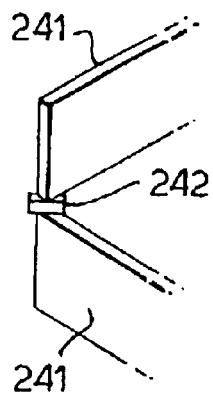
FIGS. 18 to 20 illustrate three different forms of connecting elements.
Figure 19:
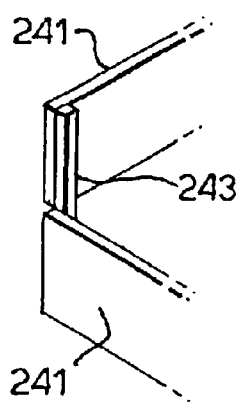
Figure 20:
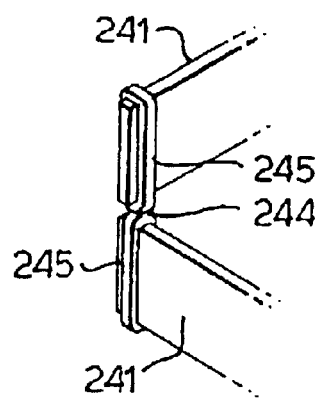

FIGS. 18 to 20 illustrate examples of connecting elements connecting electro-active elements 241. FIGS. 18 and 19 illustrate respective connecting elements 242 and 243 in the form of blocks affixed to the electro-active elements 241 eg. by adhesive. The block 242 illustrated in FIG. 18 is connected to the edges of the electro-active elements 241, whereas the connecting element 243 shown in FIG. 19 is connected to the faces of the electro-active elements 241. FIG. 20 shows a connecting element 244 consisting of a resilient elongate member having slots 245 into which the piezoelectric elements 241 are inserted and retained due to the resilience of the elongate member 244.

The wide range of choice for the material of the connecting elements such as the connecting elements 242–244 shown in FIGS. 18 to 20 allow the mechanical response of the electro-active structure to be controlled by a selection of materials having appropriate properties. This is a significant advantage. In contrast, the variation in the mechanical response of an electro-active element is comparatively restricted and difficult to control.

Figure 21:
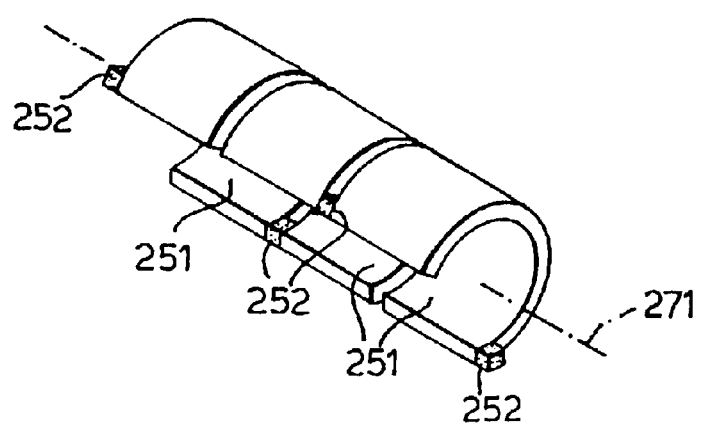
FIG. 21 illustrates a portion of a fourth discrete element structure having curved electro-active portions and alternating connection positions.

Successive electro-active elements along the minor axis may extend from the previous discrete electro-active element in alternate senses around the minor axis. Looking at this another way, the angle around the minor axis at which successive connections are positioned progresses in alternate senses, as an alternative to progressing in the same sense. In this case, successive electro-active elements are themselves activated to bend in alternative senses around the common axis, so that they produce rotations which add incrementally in the same sense along the axis. For example, the structure illustrated in FIG. 21 consists of curved electro-active elements 251, each extending around an arc of a circle about a common minor axis 253. The electro-active elements 251 are connected by connecting portions 252 positioned at alternate ends of the electro-active elements 251. Hence the connection portion 252 progress in alternate senses around the minor axis 252 as one moves along the axis 253.

As an alternative to using separately formed electro-active elements, the discrete electro-active elements may be formed together with connecting portions as a unitary member, an example of which is described later with reference to FIGS. 22 to 25.

The Curve Around the Major Axis

Next is considered the curve around which the minor axis is curved ie. the major curve.

In general, the 'curve' could take any shape. It need not be a regular geometry. It may curve about any axis, or indeed several different axes. In general, it may be any three-dimensional curve in which case the displacement direction may vary along the device depending on the local curvature. The major curve may also consist of straight portions joined by one or more bends. For example the major curve may be a regular or irregular polygon.

Particularly useful major curves are those which have a regular shape such as: a circle or an arc of a circle; a helix or a spiral (or a helical spiral); a double spiral; a series of stacked spirals; a series of coaxial helices. The major curve could be regular but non-circular (eg. with an oval or a square cross-section etc) or it could be irregular (that is a general curve). Moreover, the major curve could change its curvature along its length e.g., a helix with varying radius and/or pitch along its axis, for example to provide different mechanical properties along the structure. It can indeed be any regular or irregular 3-dimensional curved shape, chosen in dependence upon the space available and the displacement direction and force required. Further, it can be only a small part of a curve, such as merely a fraction of a turn of a helix. The curve may subtend less than 360° at the major axis.

There now follows some specific comments on certain types of major curve. In the following description, the electro-active structures are not specifically described or are formed from a continuous electro-active member extending around the minor axis in a helix. However, the major curves may be applied to any electro-active structure, including those formed from a continuous member or from discrete electro-active elements connected together.

Figure 26:
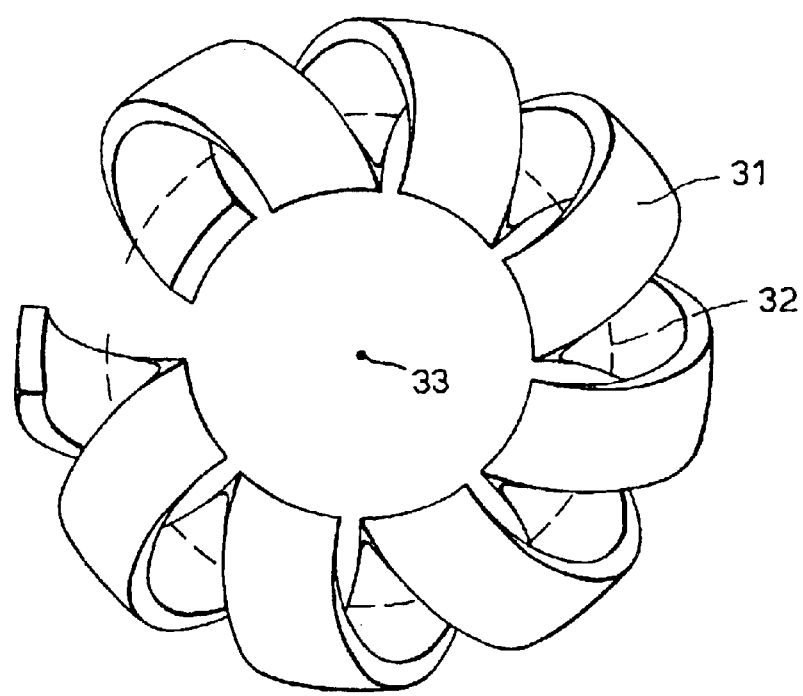
FIGS. 26 and 27 are an end view and a side view, respectively, of a structure formed from a continuous member in which the major curve is a helix of one turn.
Figure 27:
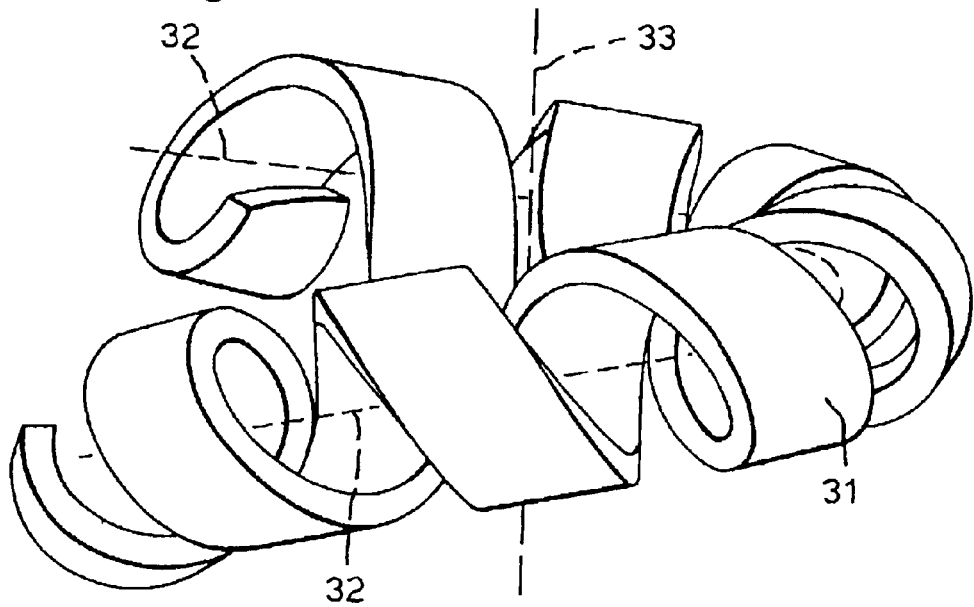
Figure 28:
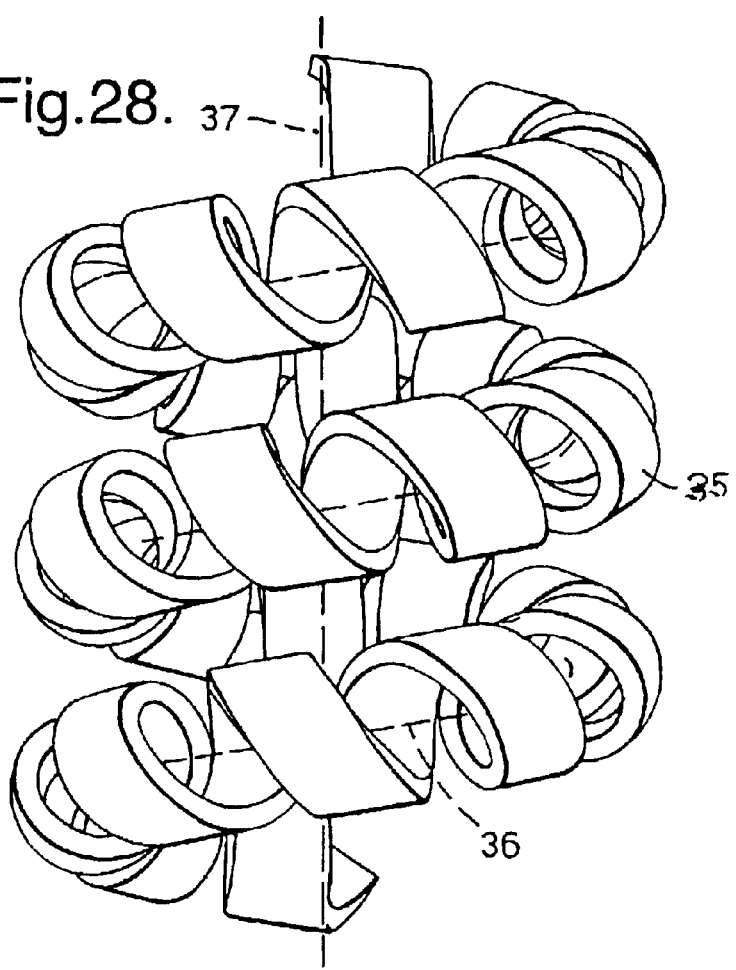
FIG. 28 is a side view of a structure formed from a continuous member in which the major curve is a helix of several turns.

The major curve may be one or more turns of a helix. For example, FIGS. 26 to 28 illustrate helical-helix structures in which the major curve is a helix and the electro-active structure is a continuous electro-active member 31 or 35 extending in a helix around a minor axis 32 or 36. FIGS. 26 and 27 are an end view and a side view respectively of a structure in which the major curve is a helix of one turn around a major axis 33 (viewed axially of the major axis in FIG. 26 and radially in FIG. 27). FIG. 28 is a side view of a structure in which the major curve is a helix of several turns (for example four in FIG. 28) around a major axis 37.

The major curve being a helix provides significant displacement along the major axis of the major curve. The displacement is proportional to the length of the device, and in principle there is no limit to its length. Displacements of many centimetres are readily achievable. For instance, in a 20 turn, 30 mm diameter major helix, formed from a 4 mm diameter minor helix of 0.5 mm tape thickness, a displacement of up to 120 mm can be achieved. If the applied force is important, then greater force is available from a shorter device made from thicker tape and with a smaller major helix diameter; thus, 2 turns of a 20 mm diameter major helix made from 1 mm thick tape generates a force of about 1 N with a displacement of a few mm. Such a device is suitable for use in a loudspeaker. Other uses for the helical-helix include actuators and positioning devices such as those otherwise served by, for instance, solenoids, relays and (linear) electric motors.

Now, a number of possible major curves are described with reference to FIGS. 29 to 41. In these figures the electro-active structure is shown in a diagrammatic form for ease of illustration, but the electro-active structure may take any of the forms described above, for example a continuous electro-active extending in a helix or other shape around the minor axis or a plurality of discrete electro-active elements connected together.

FIGS. 29 to 34 illustrate some electro-active structures with different major curves around a major axis 311. In particular FIGS. 29A, 30A, 32A and 33A are side views of the structures, whereas the remaining views are views in which the structure is diagrammatically illustrated by a single line to more clearly show the major curve. In these figures the directions in which the structures extend on activation are shown by arrows.

Figure 29A:
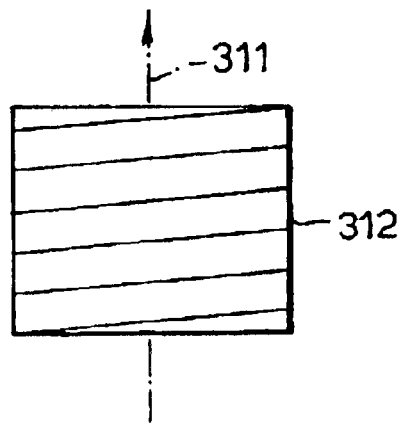
FIGS. 29A and 29B show an electro-active structure in which the major curve is a circular helix.
Figure 29B:
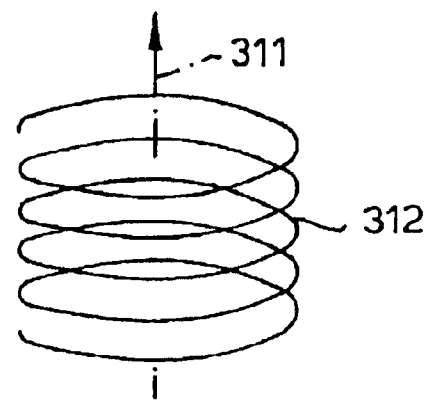

FIGS. 29A and 29B illustrate a structure 312 extending in circular helix around the major axis 311.

Figure 30A:
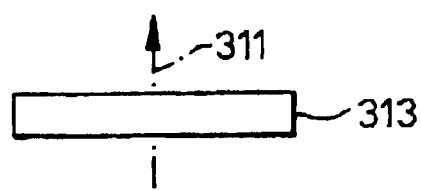
FIGS. 30A to 30C show an electro-active structure in which the major curve is a spiral.
Figure 30B:
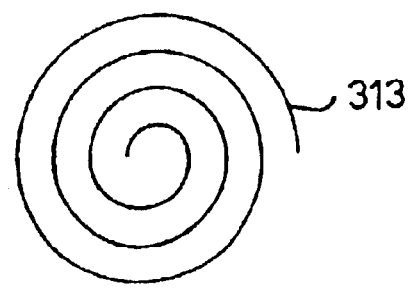
Figure 30C:
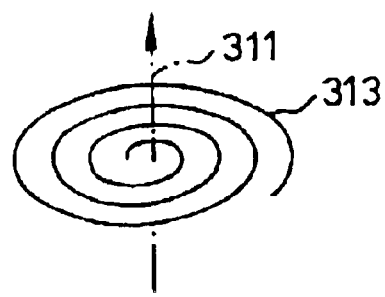
Figure 31:
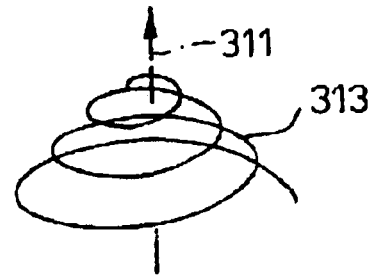
FIG. 31 shows the structure of FIG. 30 in an extended state.

FIGS. 30A to 30C illustrate a structure 313 extending in a flat spiral major curve around a major axis 311. FIG. 30B is a top plan view, whereas FIG. 30C is a perspective view. FIG. 31 is a perspective view of the structure 313 in an extended state on activation. In the non-activated state the structure 313 lies flat; its vertical height is thus merely the width of the electro-active structure. A spiral device with 2 or 3 turns may provide a vertical displacement of three times its height and more; thus, a 4 mm high spiral device may provide a displacement (of one end relative to the other) of well over 1 cm. This form is suited to applications where the space available in the axial direction is small but lateral space is less limited. The spiral can be arranged so that the end lying on the outside of the spiral is fixed while the end in the centre of the spiral moves; the actuation point is then central to the device, providing stability. Since the actuation point is at a position where the radius of curvature is small, it exhibits considerable stiffness and force capability.

Figure 32A:
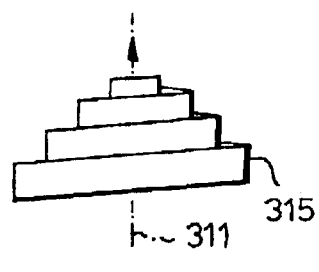
FIGS. 32A and 32B show an electro-active structure in which the major curve is a conical helix.
Figure 32B:
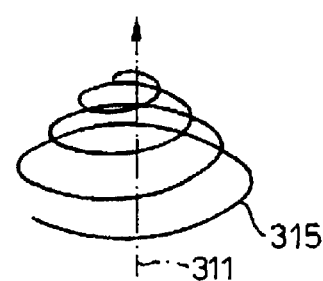

FIGS. 32A and 32B illustrate a structure 315 extending in a conical helix around a major axis 311, that is a helix in which the diameter decreases from one end to the other. The larger diameter end is relatively massive, while the smaller diameter end is relatively lightweight, which is advantageous for applications requiring fast movement, as mentioned above. Varying the pitch from one end to the other has a similar effect. Of course, these variations, like the ones discussed previously, do not need to scale simply from one end to the other; they may vary in any manner along the length of the major helix. Any of the variations discussed may be combined together, providing a very flexible means of designing a device to provide exactly the required properties.

Figure 33A:
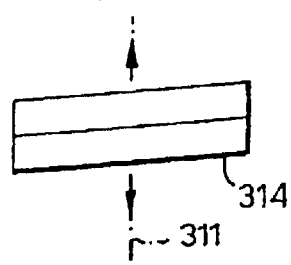
FIGS. 33A to 33B show an electro-active structure in which the major curve is a double spiral.
Figure 33B:
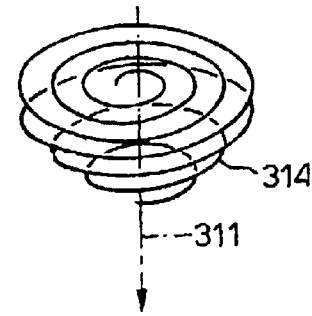
Figure 34:
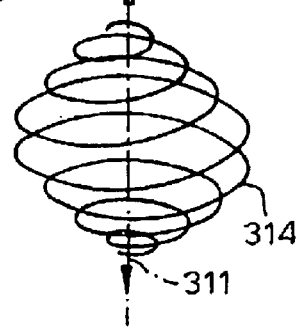
FIG. 34 shows the structure of FIG. 33 in an extended state.

FIGS. 33A to 33C illustrate a structure 314 extending in a double spiral around a major axis 311. FIG. 33B is a perspective view of the structure and FIG. 34 is a perspective view of the structure on activation. Preferably, as in FIGS. 33 and 34, the double spiral starts in the centre, winds outwards, and then winds back inwards to form a second spiral directly above the first. This provides the advantage that both ends may be central, providing directly opposed actuation points. The major curve can be extended with further spirals to provide a series of stacked spirals. Such major curves provide a very compact device, as there is very little space between the windings. Similar compactness can be achieved in a series of coaxial helices.

Although less compact, incomplete spirals, in which the turns do not extend all the way to the centre, are likely to be easier to make and still offer very significant displacements.

Figure 35B:
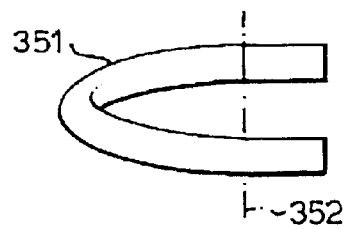
FIGS. 35A to 35C show an electro-active structure in which the major curve is an arc of a circle.
Figure 35A:
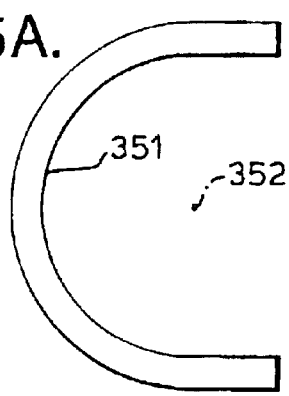

Helices and spirals provide a long length of bender, and thus relatively very large displacements. Where smaller displacements are required a shorter curve suffices, for example a circle or an arc of a circle. As an example, FIG. 35 show a structure 351 in which the major curve is an arc of a circle around a major axis 352 which is the geometric axis of the curve. In particular, FIG. 35A is a plan view of the structure 351, and FIG. 35B is a view from the side and above.

Figure 35C:
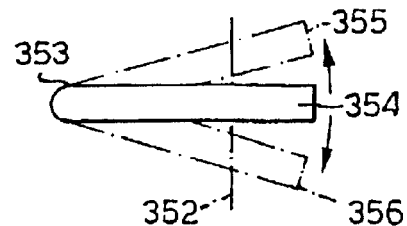

FIG. 35C shows a side view of the structure 351 with one end 353 fixed. The movement of the structure 351 on activation is shown by arrows. The structure 351 moves out of the plane of the major curve so that the free end 354 moves to a first position 355 in activation with one polarity and in the opposite direction to a second position 356 on activation with the opposite polarity. In both cases, the response is linear with position around the major curve, because the structure is uniform, thereby generating the same degree of rotation at any position around the curve which has a constant curvature.

To re-iterate, if the major curve is a regular curve such as a helix, a circle or part of a circle displacement on activation out of the plane of the curve will be in the direction of the axis of curvature. If the major curve is curved into a non-circular geometry, the movement of any section will be out of the plane of the curve of that section with the overall movement being a summation of the movements of all the sections. In the case of a major curve of a general 3-Dimensional shape, the displacement direction is determined by the geometry; so the actuation point may be caused to follow any desired path by suitable design of the major curve. Applications are those where the desired movement is not linear, such as for instance windscreen wipers and electric shavers.

Another class of major curve providing the device with useful properties is the family of re-entrant curves, which provide opposite displacements in portions of the major curve with opposite curvature ie around different major axes. For instance, if the major curve is a sinusoid, the "peaks" and "troughs" are of opposite curvature and the "upslopes" and "downslopes" move perpendicular to the plane of the sinusoid in opposite directions. A sinusoid with more than one cycle provides multiple actuation points and is thus useful for distribution of load. If the displaced "upslopes" and "downslopes" are made to engage some form of ratchet mechanism, relative motion in the longitudinal direction of the sinusoid results. Motion is maintained by successive reversals of the actuation voltage. When actuated in one direction, the "upslopes", say, move to engage the ratchet, causing motion; when actuated in the other direction, the "upslopes" disengage, allowing them to engage the next position of the ratchet on the next cycle. Such a device wrapped around in a circle could be used to provide rotary motion if the component which is to be rotated is fitted with an appropriate ratchet mechanism.

Figure 36:
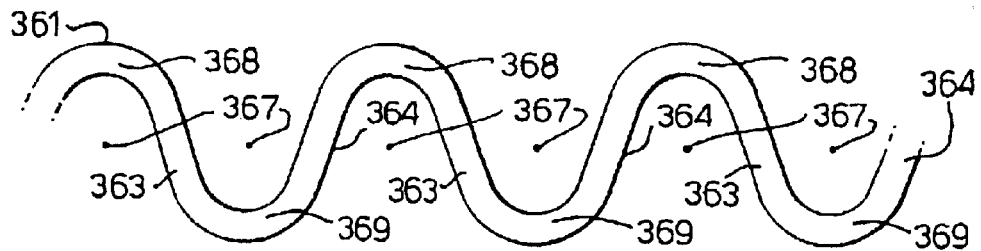
FIGS. 36 to 38 show an electro-active structure in which the major curve is a sinusoidal curve.
Figure 37:
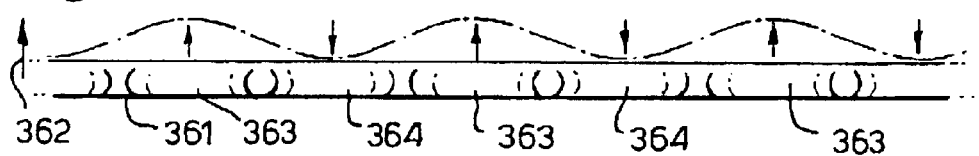
Figure 38:
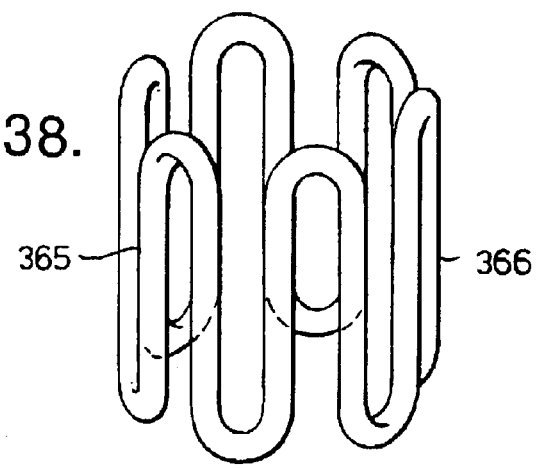

For example, FIGS. 36 to 38 show a structure 361 in which the major curve is in the form of a sinusoidal curve. FIG. 36 shows the structure 361 from above curving around plural major axes 367. The resulting vertical movement out of the plane of the sinusoidal curve on activation is shown diagrammatically in FIG. 37 which is a side view of the structure. In a sinusoidal curve, the peaks 368 and troughs 369 have the highest degree of curvature and the curvature decreases to zero at the zero-crossing points in between. The peaks 368 curve around the major axes 367 in an opposite sense from the troughs 369, so displacement of the upslopes is in an opposite direction from displacement of the downslopes. This causes alternate zero-crossing points 363 and 364 to be displaced in opposite directions out of the plane of the major curve. FIG. 38 shows the structure 361 of FIG. 36 wound around a cylinder 366.

Figure 39:
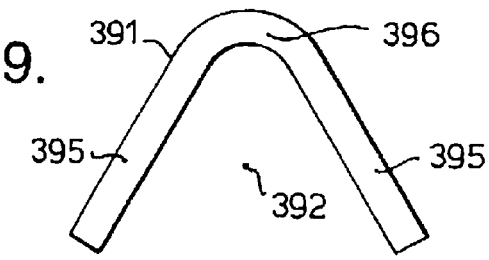
Figure 40A:
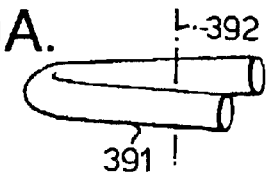
Figure 40B:
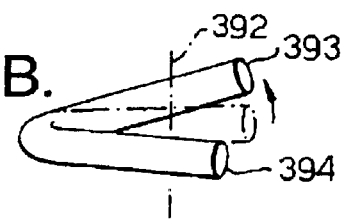

FIG. 39 shows in plan view a structure 391 with a very simple form of the major curve as two straight portions 395 with a relatively sharp angle 396 in between so that the structure 391 curves around an axis 392. This is intended to illustrate the concept of the "general curve", to which the idea of the invention applies. FIG. 40A is a side view. FIG. 40B is a side view of the structure on activation with a fixed end 394. There is little movement in the straight portions 395 but the curvature in the sharp angle lifts the free end 393 relative to the fixed end 394.

FIG. 41 shows a device 411 in which the major curve is a helix of which the pitch varies along the length of the device. In the device shown, the major helix has a small pitch at its base 412 and a larger pitch at its tip 413.

The major curve need not be composed of several turns, nor even of one complete turn; it may instead be less than a single full turn (of, say, helix or circle)-though for a significant effect on activation it has a total curvature of at least 30° and most preferably at least 90°. There is really no upper or lower limit to the size of the invention, but even so some indications can be given. Thus, typical devices formed from a continuous electro-active member use a tape of thickness around 0.1–2 mm and width of around 1–10 mm, and are shaped into a minor helix of around 1–10 mm diameter which is itself then wound into a major curve of around 2–50 mm diameter. For a typical such device made from 0.6 mm by 5 mm tape in a 4 mm diameter coil wound into a 30 mm diameter curve, the minor curve curvature is around 30° per mm of tape and the major curve curvature is around 4° per mm of coil.

Multiple Tapes and Structures

As so far described the device has a single electro-active structure formed by a single continuous member or a single plurality of discrete elements connected one after the other. This is not necessarily the case, however. A variety of more complex structures produce the same effect and are within the scope of the present invention. For example, the device could have more than one electro-active structure. The structure could be formed from two or more continuous members extending coaxially along the minor axis, perhaps forming a double helix like that of DNA. Two or more continuous members extending side-by-side, or coaxially, along the minor axis provides an extra degree of variation, as they can be activated separately, resulting in a range of motions and displacement directions of the major curve. In general when the structure is formed from continuous members, the electro-active structure may have more than one member extending in a minor curve around and along the minor axis, and/or may have more than one minor curve extending along the major curve.

Similarly, the structure may comprise two or more groups of discrete elements, the elements of each group being connected together to form a respective chain of discrete elements. Other more complicated structures of discrete elements could similarly be used.

A structure formed from plural continuous members may provide several actuation points, and thus distribute the load. For instance, a device comprising three or more structures extending coaxially in helices around a major axis provides three actuation points at one end in a plane transverse to the major axis. The actuation points are equally spaced around a circle, providing a very stable contact. Further, the three structures may be activated differentially, resulting in different displacements of the three actuation points. Thus, a disc or other object resting horizontally (by a suitable jointing mechanism if necessary) on the three actuation points of a vertical 3-strand major helix can be made to tilt in any direction. Given that activating the three strands together results in vertical motion, this device is equivalent to a 3-axis motor, but is considerably less complex than such a motor, and with the benefits of quiet operation, low mass, compactness, and speed of response. It is also non-magnetic. Its applications include, for instance, tilting mechanisms for reflectors for laser-light, as used in laser-light displays and laser printers, satellite tracking mechanisms, and tracking and focussing mechanisms in cameras.

Two or more structures may be stacked, placed coaxially or distributed to provide variations in displacement, force or load distribution. For instance, stacked spirals provide compact high displacement devices; coaxial helices provide compact high force devices; and distributed structures provide separate actuation points which can be activated either in concert or separately.

FIGS. 42 to 44 illustrates structures formed from two electro-active members 421, 422 instead of one. FIG. 42 shows the structure notionally unwound so that the two electro-active members 421, 422 are arranged side-by-side. FIG. 43 shows a structure 423 wherein the members 421, 422 extend in a minor helix 423 which is close wound with minimal gaps between the members 421, 422. FIG. 44 shows a structure 423 wherein the members 421, 422 extend in a minor helix 423 with a larger pitch and hence greater gaps between the members 421,422. This is in fact also what the close-wound structure of FIG. 43 looks like on activation.

Structure and Construction

By suitably selecting the form of the electro-active portions and the form of the structure, so there may be constructed a device having the desired properties. For the most part these will be provided by devices of a regular structure, such as the helical-helix form, but other more unusual forms might supply special results. For example, the signal input to the device to cause it to actuate might be in some way irregular—it might include imperfections and/or non-linearities—and the geometry of the device could be selected to compensate. Again, a careful choice of geometries could result in a device that has end-of-actuator motion (i.e. along defined paths in space) which were not pure rotations (as per straight helix), or pure linear (as per helical-helix), but along curved and twisting paths.

In the case of a device formed from a continuous electro-active member, the member is shaped as a curved curve, for example a length of the minor curve wound into a further major curve, as discussed above. Most conveniently it will in fact actually be made by first winding a flat, flexible/plastically-deformable tape into the required curved shape—a long helicoid, say—and then, while the tape material is still flexible, further winding that helicoid into a suitable curved shape—say, into another helicoid. The dimensions and exact form of the tape, the minor curve and the major curve can be whatever is best suited to the purpose of the device.

For example, for use in the construction of a low frequency (<1 kHz) audio driver, a tape of regular and constant rectangular cross-section of total thickness 1 mm and 8 mm width, comprising two or more active piezoelectric layers with appropriate electrodes, may advantageously be employed, this tape being wound into a 6 mm diameter minor helix and further wound into a 30 mm diameter major helix, with three turns of the major helix.

To re-iterate, some particular structures and major curves have been described above, but the device of the invention may be of any form, including curves which are regular or irregular, 2- or 3-dimensional, circular or non-circular, and of constant curvature or varying curvature (including opposite curvatures). The properties of the device can be tailored by selection of: the constitution of the layers of which the tape is made; the number of layers, tapes and minor curves; and the physical parameters of the layers, the electrodes, the tape(s), the minor curve(s) and the major curve(s). Further, any of these parameters may be varied along the length of the device, and any particular device may include variations along its length of none, some or all of these parameters.

Multiple Electrodes

In the case of embodiments formed as a continuous electro-active member, each electrode is envisaged as continuous from one end of the tape to the other. Usually the electrode will be conductive so that the same voltage appears across the entire length of the structure, although the electrodes could alternatively be resistive so that a varying voltage is developed along its length. However, the electrode may instead be split at various points along the tape, producing a multi-electrode device. In the simple case, the flat surfaces of each piezoelectric layer are covered with an electrode. If, instead, the electrode is non-continuous—that is, a break in the electrode layer running across the width of the tape is provided at intervals along the tape length, and corresponding breaks are provided in the other electrodes—then the tape consists of two or more regions along its length which are electrically isolated from each other and which can be activated separately. Once wound into a device, the multi-electrode form allows the separately-electroded sections of the device to be caused to move differentially. For instance, alternate sections of a helical-helix device could be made to be "on" or "off", allowing a helical-helix device to display axial displacement in some sections, separated by undisplaced sections. If the section activation is then reversed (those sections which were "on" turned "off" and vice versa), a wave of displacement then moves along the device, which, if on a suitable substrate, is caused to move along like a worm.

The formation of a multi-electrode device is described with reference to FIGS. 45 to 50.

Figure 45:
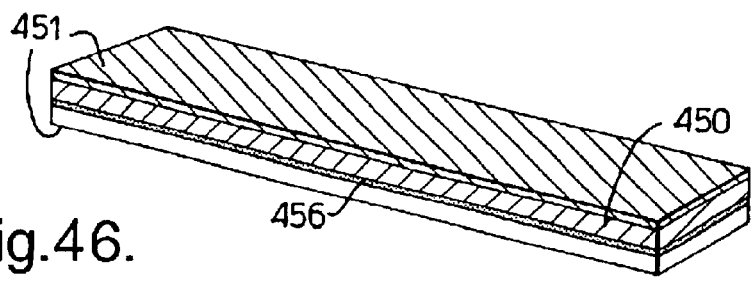
FIGS. 45 and 46 are perspective views of electro-active members respectively without and with split electrodes.
Figure 46:
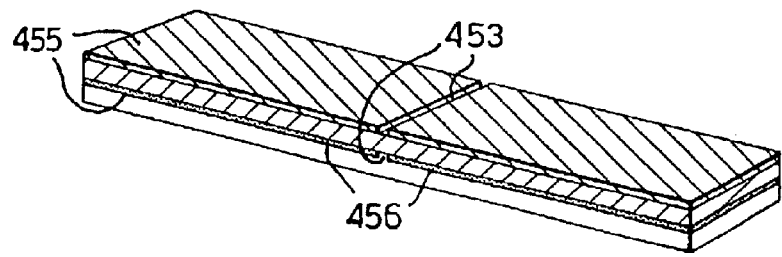
Figure 47:
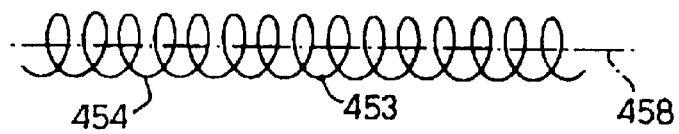
FIGS. 47 to 50 illustrate different electro-active structures having sections with separate electrodes.
Figure 48:
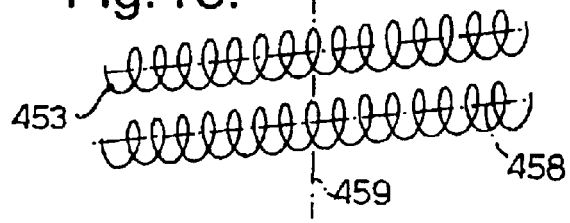

FIG. 45 shows a member of unimorph construction having an electro-active layer 450 and a non-active layer 456 with electrodes 451 applied to the two faces of a piezoelectric layer 450 in the normal manner. In contrast, FIG. 46 shows a member of the same unimorph construction but in which each electrode 455 is split into two sections 452 which can be separately activated. In each case, the split 453 runs across the width of the tape, roughly halfway along it. FIG. 47 shows diagrammatically a long length of such a split-electrode member extending in a minor helix 454 about a minor axis 457, with the location of the split 453 in the electrode midway along the helix. FIG. 48 shows a side view of the structure of FIG. 47 extending in a major curve of a helix of two turn 458 around a major axis 459, the split 453 being between the two turns 458 such that each turn 458 has separate electrodes.

Figure 49:
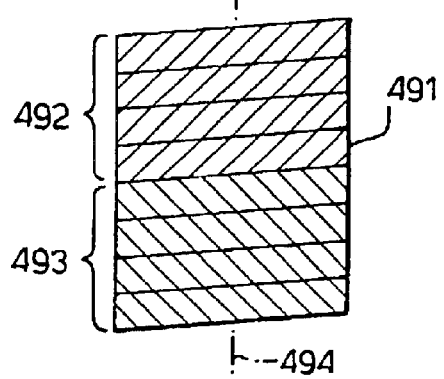
Figure 50:
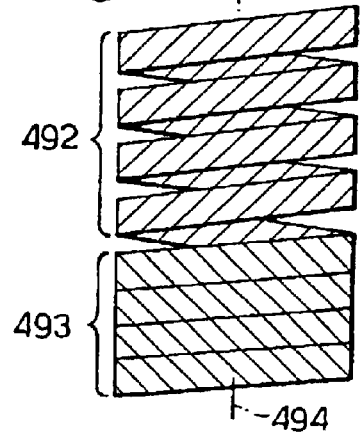

FIGS. 49 and 50 show a structure 491, for example a continuous member curved in a minor helix, extending in a helix around a major axis 494 with eight major helix turns and two sections 492, 493 with separate electrodes of four turns each (shown differently-hatched for clarity). FIG. 49 shows the structure with both sections 492, 493 inactivated. FIG. 50 shows the structure with one section 492 in the inactive state, and the other section 493 in the activated state.

Figure 51A:
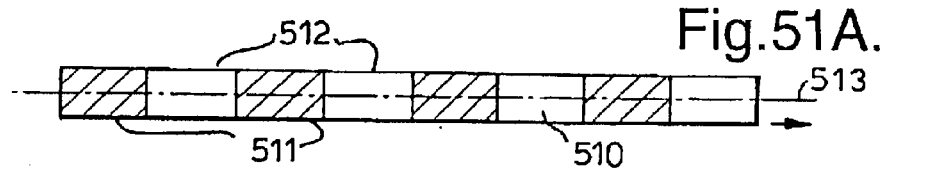
FIGS. 51A to 51D illustrate electro-active structures having sections with separate electrodes, with alternate sections commonly connected.
Figure 51B:
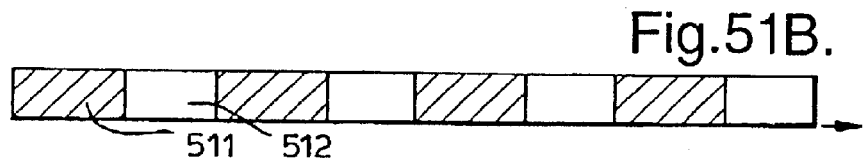
Figure 51C:
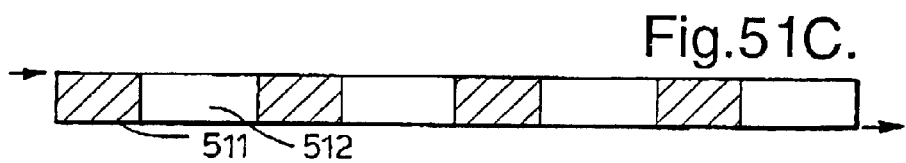
Figure 51D:
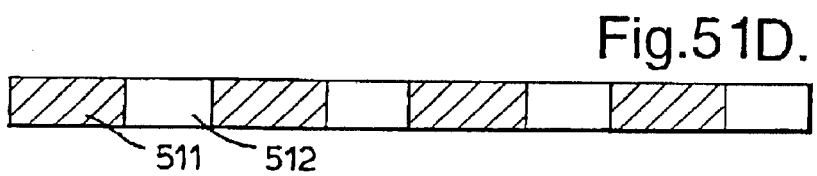

FIGS. 51A to 51D show a multi-electrode device 510 in which the major curve is a helix around axis 513, but the individual turns of the helix are not shown, merely the length of the resulting major helix. Successive sections 511, 512 of the device 510 have separate electrodes. A first set of alternate sections 511 have electrodes which are commonly connected as do the second set of remaining alternate sections 512. FIGS. 51A to 51D show a sequence of electrode activations which can be used to provide worm-like movement. In FIG. 51A, neither sections 511 nor 512 are activated. In FIG. 51B, the sections 511 of the first set are activated, in FIG. 51C the sections 512 of the second set are activated and in FIG. 52D, the sections 511 of the first set are activated again. The net result is that the device 510 inches along in the direction of the arrows.

Apart from applications in worm-like toys and novelties, such a multi-electroded device has applications in mechanisms where two or more items require to be moved separately but in controlled relation to each other, as, for example, in an interferometer. A further application is an acoustic transducer (loudspeaker) driver, where individual sections of a multi-electroded device can be turned on separately, such that the resulting amplitude of movement is the sum of the movements of the individual sections. For instance, a major helix of 16 turns comprising 8 separately electroded sections of 2 turns each, could be activated such that only one, or more than one up to a total of eight, section(s) operate, giving 8 discrete levels of amplitude. This is particularly useful in digital loudspeakers of the unary type, as disclosed in WO-A-96/31,086. Similarly, a digital loudspeaker of the binary type would comprise separately-electroded sections which were related to each other in their length by the proportions 1:2:4:8 etc.

Figure 52:
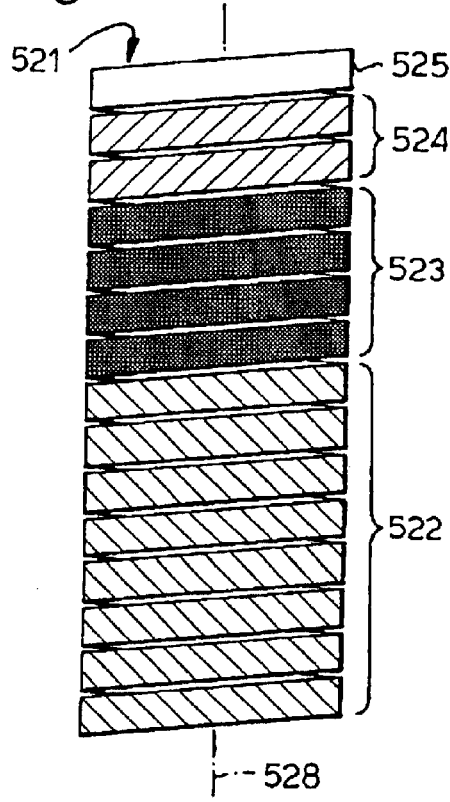
FIGS. 52 and 53 illustrate different electro-active structures having sections with separate electrodes suitable for use as digital actuators.
Figure 53:
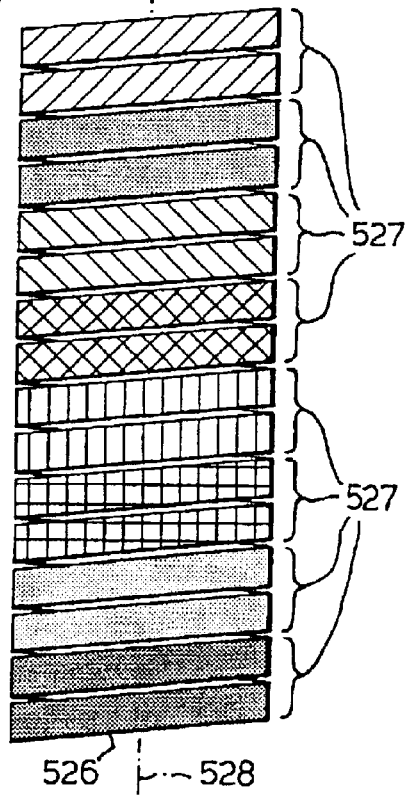

FIGS. 52 and 53 show devices having sections with separate electrodes suitable for use as digital actuators, for example, in a digital loudspeaker.

In FIG. 52, there is depicted a structure 521 extending in a helical major curve around a major axis 528 with four separately-electroded sections 522, 523, 524, 525 having eight major helix turns, four turns, two turns and one turn, respectively. Each section 522 to 525 can be activated separately, allowing the total displacement to vary directly as a binary digital activating signal. FIG. 53 shows a 16 turn major helix 526 with eight separately electroded sections 527, suitable for use with unary digital signals.

The disposition of activation (and sensor) electrodes described above for piezoelectric devices applies equally, with the appropriate changes, to electrostrictive devices in which the active layers are made of electrostrictive material.

Devices with Integral Sensors

The electro-active structure may include sensor electrodes the purpose of which is to output a signal generated by the sense layer between them which signal provides information as to how the device is behaving. This use of sense layers and sensor electrodes is described in some detail in GB-A-2,329,514, in the section headed "Piezoelectric driver devices with integral positioning and control mechanisms" which is incorporated herein by reference. Briefly, though, such sense layers may be single or multiple, and of piezoelectric or piezoresistive material. Each is integrated into the electro-active structure as either inner layer(s) or as surface layer(s), preferably parallel to and electrically isolated from the other piezoelectric layer or layers comprising the unimorph, bimorph or multimorph. The sense layer(s) if piezoresistive have sense terminals connected to the ends of the layer(s) at either end of the structure and if piezoelectric have sense terminals connected to electrodes covering the (radially) inner and outer surfaces of the layer(s). In the case of a piezoresistive sense layer, the sense layer acts rather like a conventional strain gauge. The provision of an electrical current through the layer, and simultaneous measurement of that current and of the voltage across the layer as measured at the sense terminals, provides a direct indication of the strain experienced by the device, and thus of its extension or contraction, which information may be used in a feedback control loop to, for example, provide either constant force, constant velocity, constant acceleration, or constant position operation of the device as a linear actuator for precision mechanical control purposes. Such a feedback control system is able to compensate not only for load variations, but also for compensation of any hysteresis in the piezoelectric actuator itself.

Methods of Manufacture

The electro-active portions, whether formed as a continuous member or discrete elements, may be made using any known technique. They may advantageously be made by extrusion or calendering, for example by co-extrusion of two (or more) layers of the chosen plasticized material or by the co-calendering of these materials, to form a unimorph, bimorph or multimorph.

A multilayered construction may be made through lamination of thinner layers, onto which electrode patterns have previously been printed. These thinner layers may be made by any suitable route, such as high shear mixing of a ceramic powder, polymer and solvent mixture, followed by extrusion and calendering. Alternative routes, such as tape casting or that referred to as the Solutech process, known in the field of ceramics, may be used.

The above techniques produce a flat, straight, continuous electro-active member which may itself be formed into the structure or cut to produce discrete electro-active elements.

Devices of the invention formed from continuous electro-active members may conveniently be made by actually winding the member into the desired form, for example by first winding the member into a long helix or other shape and then winding that structure into the major curve. In that case, there must exist in the initially formed member a degree of flexibility/plasticity such that the materials from which the member is formed may be deformed into the forms necessary.

One suitable method of manufacture is a two-stage one, and is best described with reference to making a device that is a member extending in a helix (the minor helix) around the minor axis and in which the major curve is also a helix. However it is equally applicable to other minor curves and other major curves.

In the first stage, to form the minor helix, electroded laminated tape in the green-state is flat-wound around a suitable cylindrical former which itself is made of a material that is able to deform plastically. This step produces a long straight helix. In the second stage this helix is itself coiled (into the major curve) by the simple method of winding the composite minor helix and its former around a suitably-made second former. This may be a threaded, plastically-deformable bar with the appropriate pitch and depth of thread. After this step, the tape material is allowed to set, either through cooling or through evaporation of a constituent solvent, and once set, and relatively stable physically, the two helices are freed from their respective formers (first the major helix from its former, and then the minor helix is removed from its former) either by simply unthreading them or, if the formers have been made of a suitable material, melting, burning or dissolving the formers away.

Once the coil is removed from the formers it is placed on a sintering former, of dimensions such as to allow for the 12–25% linear shrinkage expected during sintering. The constituent polymers are burned out of the material, typically at up to 600° C., and the material is then densified through further sintering at temperatures, typically between 1,000° C. and 1,200° C.

In an alternative manufacturing route, a multilayer tape, including the electrode layers, is produced by co-extrusion. The extrusion parameters can be set such that the emerging material is curved, for instance by arranging it so that the material emerges from the die more quickly on one side than on the other. This is a known process for other products, used for instance in the production of "Spirale" pasta in the form of a thin tube following a helical path. The minor helix is then produced direct from the extrusion die, and lengths can then be wound on to a former for production of the major helix. Removal of the former and sintering is then carried out as above.

As an alternative to forming the structure by shaping a deformable member around the minor axis, the structure may be formed from an electro-active member shaped as a cylinder with an appropriate layered construction of electro-active layers and electrodes. The cylinder may then be cut along a helical line around the cylinder to leave a continuous member extending in helix around the axis of the cylinder which forms the minor axis. In this case the electrodes are preferably conductive electrodes extending along the entire length of the member.

The electrodes may be formed in any way known for a layered electro-active structure. The electrodes may be formed as an integral part of the manufacture of the electro-active member, eg. extruded therewith. Further electrodes, which may be activation electrodes or may be terminal electrodes to allow access to the various internal and external electrodes in the member, may then be applied as an ink or through fired-on silver paste, or some other appropriate technique.

Manufacture of the electro-active structures in the form of separate electro-active elements is very simple. The electro-active elements themselves can be made using any known technique as discussed above. Then the discrete electro-active elements are simply connected together building up the structure into the desired form, for example, as shown in FIGS. 14 and 15.

As an alternative to using separately formed electro-active elements, the discrete elements may be formed as a unitary member with unitary connecting portions. For example, such a structure may be manufactured by the following method described with reference to FIGS. 22 to 25. The method uses a continuous electro-active member 261 which is formed using any known technique as discussed above.

Figure 22:
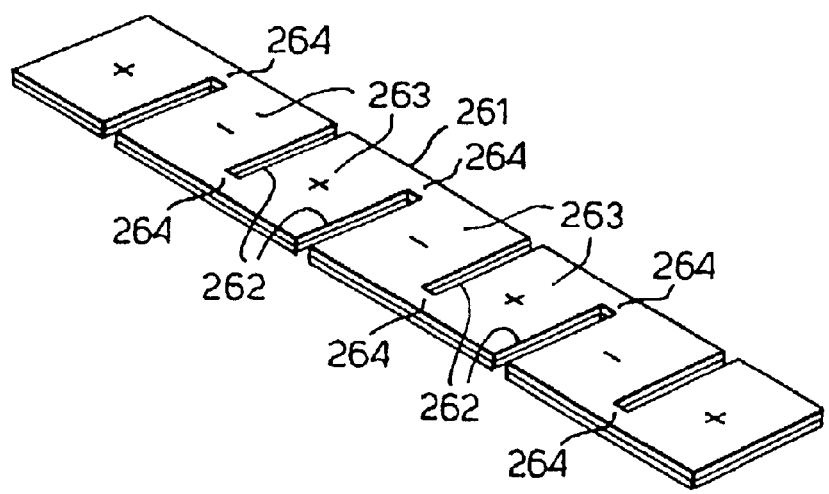
FIGS. 22 to 25 illustrate a method of manufacture of a discrete element structure as a unitary member.

In a first stage, the elongate member 261 is cut by cuts 262 extending partially across the face of the elongate member 261 from alternate sides as illustrated in FIG. 22. As a result, the elongate member 261 is shaped into connected discrete electro-active elements 263 formed longitudinally between the cuts 262 and connecting portions 264 formed between the ends of the cuts 262 and the sides of the elongate member 261. As the cuts do not sever the elongate member 261, both the elongate member 261 and the electrodes formed thereon remain continuous or unitary (although the electrodes may subsequently be split between each element 263 if it is desired to independently pole each element 263).

Alternate discrete electro-active elements 263 will be poled (post-sintering) in opposite senses as indicated by the positive and negative signs on each discrete element 263 in FIG. 22.

Figure 23:
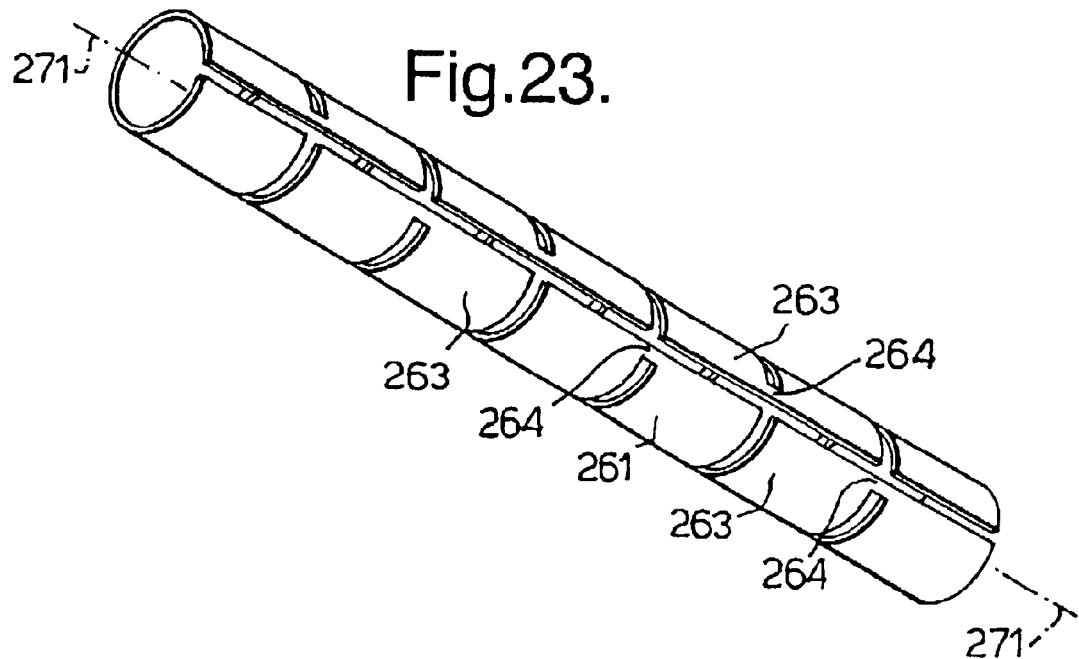
Figure 24:
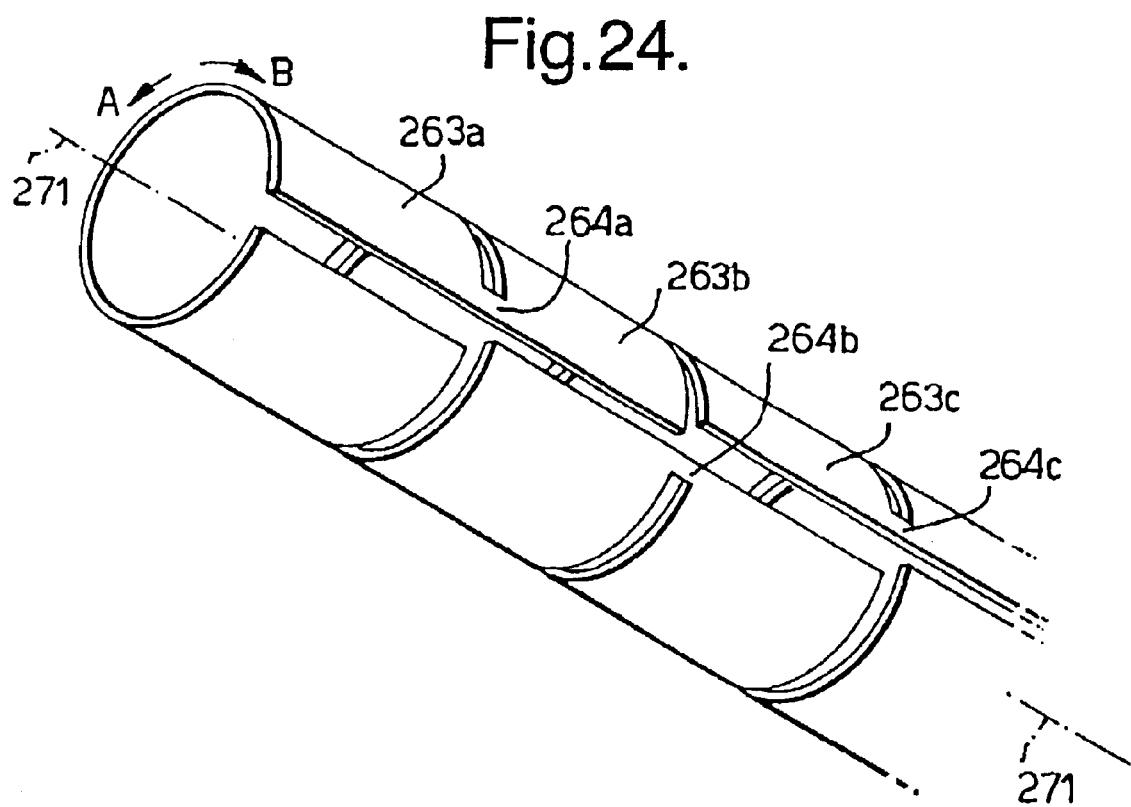

In a second stage, the elongate member 261 is curved around axis 271 extending longitudinally along the elongate member 261, as shown in FIG. 23. Consequently, each electro-active element 263 extends circularly around the axis 271 and the connecting portions 264 progress in alternate senses around the axis 271 as one moves along the axis 271. This curving of the elongate member 261 may be performed around a former (not shown).

Figure 25:
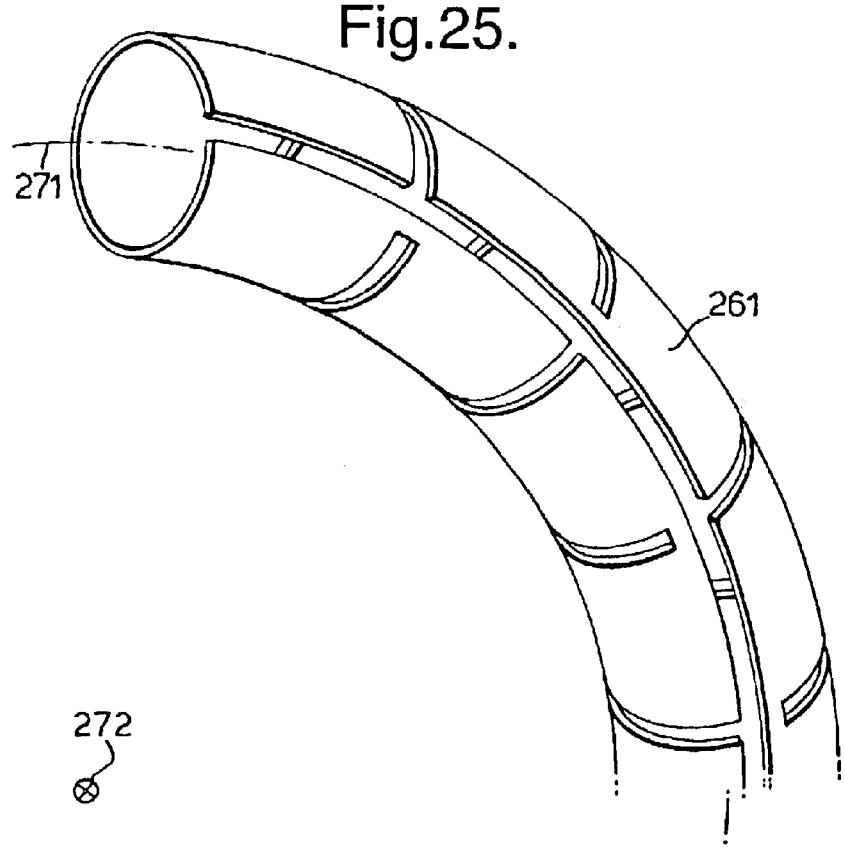

In a final, pre-sintering fabrication step, the member 261 is curved into the major curve around the major axis 272 as illustrated in FIG. 25.

In this technique, there must exist in the elongate member 261 a sufficient degree of flexibility/plasticity such that the material from which the tape is formed may be deformed into the curved forms as necessary. As described above for structures formed from a continuous member, subsequent to such forming the member may be set by heating to burn out the constituent polymers and densified through sintering typically at a higher temperature between 1000° C. and 1200° C., and finally poled.

After sintering and poling, upon activation the curved elongate member 261 rotates around the axis 271. The same voltage is applied in the same sense to each electro-active element 263. As the electro-active elements 263 are alternately poled, they bend in alternate senses around the axis. For example, along a section of the member 261 illustrated in FIG. 24, the first section 263A bends outwardly and therefore the first connecting portion 264a in a first sense A. The second portion 263b bends inwardly and rotates the second connecting portion 264b in the same sense A as the first connecting portion 264a. Similarly, the third electro-active element 263c bends outwardly and so rotates the third connecting portion 264c in that same sense A. Therefore, actuation of all the elements in alternate senses causes a relative rotation of the electro-active elements in the same sense, because the successive connecting elements progresses extend around the minor axis in alternate senses. In this way an incrementally adding rotation is generated along the length of the member 261.

In all cases, the electro-active material may be poled to allow proper activation by application of appropriate poling voltages to the electrodes.

Uses

An electro-active device of the invention has a wide range of uses.

In one mode of operation it is electrically activated. In this case, it may be used as a driver to convert a signal applied to the electrodes of the electro-active device into relative movement along the major axis. For example, in this mode of operation it may be used as the linear actuator in a loudspeaker, a data-storage disk-head positioner mechanism, a lens or mirror positioning device, a positioner component in a computer printer or scanner, or as a replacement for an electromagnetic solenoid in a wide variety of applications including door latching, relay and servo systems. Use in motor car control systems is also envisaged, for example for throttle and choke control, and possibly for driving main and wing mirrors. And the low weight and low power consumption of the actuator of the invention are likely to give rise to quite new applications—applications which are simply impractical with present actuators.

To enable use of the device it may have means enabling it to be mounted on some relatively-fixed body leaving parts of it—usually one or both ends—to move as appropriate when the component is suitably activated. Several shapes have already been described hereinbefore, with comments showing how they behave when activated, and what job they might be utilised to do.

In yet another aspect, therefore, this invention provides the use of an electro-active device of the invention to enable a force to be applied to some object that needs to be pushed or moved. More specifically, such a use involves the device being so mounted and orientated with respect to the object that on activation the orientation of the curved axis changes to cause the device physically to press against the object, and thus to cause the required force to be exerted by the device on the object.

Figure 54:
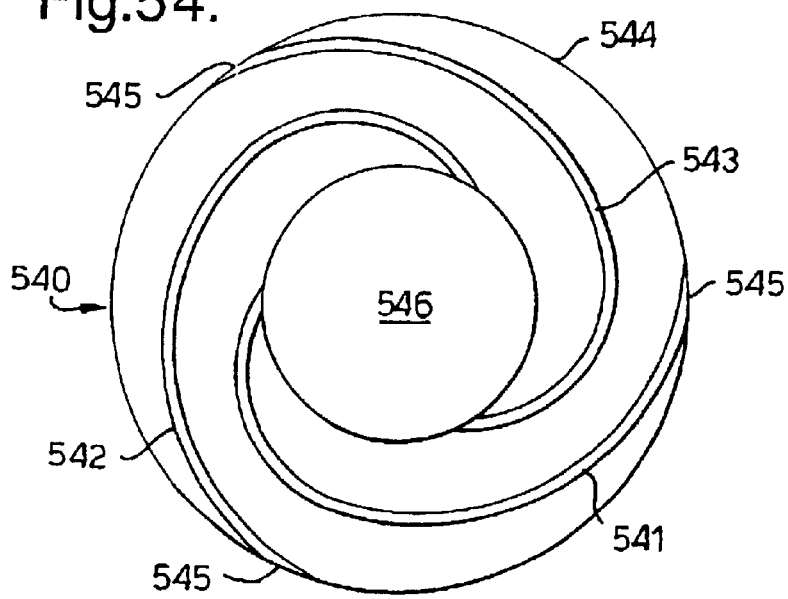
FIGS. 54 to 57 illustrate a device for moving a support.
Figure 55:
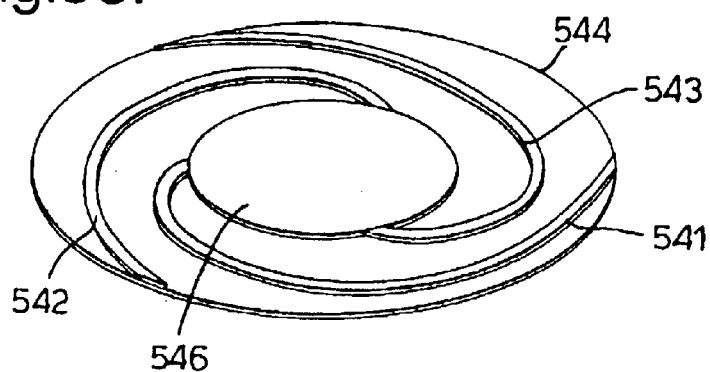
Figure 56:
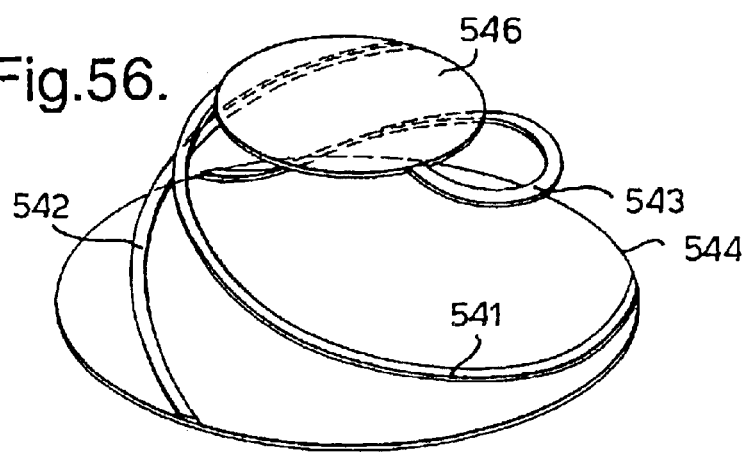
Figure 57:
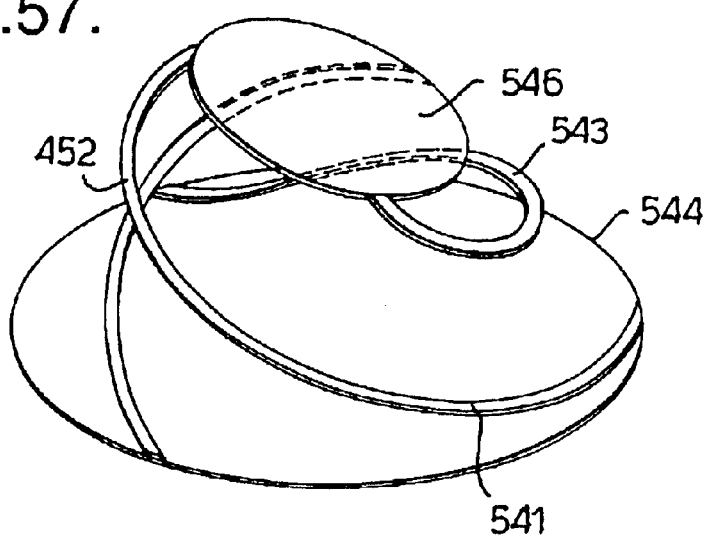

FIGS. 54 to 57 show a positioning device 540 using three electro-active devices 541–543 in accordance with the present invention. FIG. 54 is a plan view of the positioning devices 540 and FIGS. 55 to 57 are side views. The positioning device employs three identical electro–active devices 541, 542, 543 arranged regularly around a support 544 and each having a major curve in the form of half a turn of a spiral. The electro–active devices 541–543 are fixed to the support 544 at their outer (bottom) ends 545. Their inner (upper) ends are fixed to the underside of a disc 546, which is an object to be positioned, such as a mirror.

When the devices 541–543 are activated by a common electrical signal, they all extended vertically upwards by the same amount to lift the disc 546 keeping it level, as shown in FIG. 56. Alternatively by activating the electro–active devices by differential signals, the devices 541–543 extend by different amounts, hence tilting the disc 546. For example, FIG. 57 shows the positioning device 540 when a first device 541 has extended vertically more than a second device 542 which in turn has extended more than the third device 543. Thus this positioning device 540 is able to lift the disk 546 vertically and tilt the disk 546 about 2 orthogonal horizontal axes.

Figure 58:
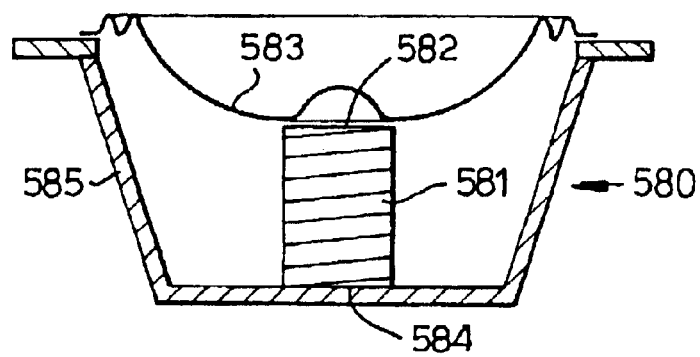
FIG. 58 is a cross-sectional view of a loudspeaker employing an electro-active device.
Figure 59:
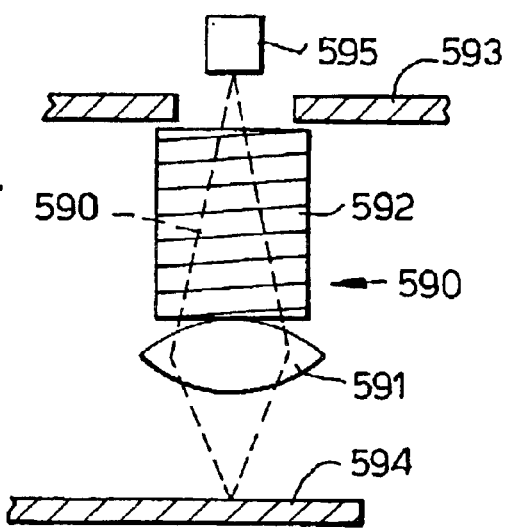
FIG. 59 is a cross-sectional view of a laser focus lens positioning device employing an electro-active device.

FIGS. 58 and 59 show uses of an electro–active device of the invention in which the major curve is a helix, in particular as a loudspeaker cone driver in FIG. 58 and as a CD-reading laser focus lens positioning device in FIG. 59.

Electro-active devices according to the present invention may be used as a loudspeaker motor. Most conventional loudspeakers use electromagnetic moving-coil motors to drive a stiff cone back and forth to reproduce an electrical waveform as a sound waveform. These suffer from linearity and efficiency problems. The device of the invention provides a superior alternative.

For example, FIG. 58 shows a loudspeaker 580 in which an electro-active device 581 in which the major curve is a helix is attached at one (axial) end 582 to the rear of a conventional loudspeaker cone 583 with the other (axial) end 584 fixed to the loudspeaker frame 585. Thus the electro-active device 580 replaces the normal magnet and voice-coil assembly. Activation of the device 581 by an AC waveform in the acoustic frequency range causes its axial length to increase and decrease in synchronism with the changing waveform, which in turn will cause the loudspeaker cone 583 to oscillate back and forth, thus producing compression and expansion of the adjacent air and so causing sound waves to emit from the speaker.

In such an application it is appropriate to ensure that the fundamental (axial mode) resonant frequency of the coiled-coil device/speaker-cone & suspension assembly is at about or lower than the lowest frequency of interest to be reproduced.

The advantages of this arrangement over the conventional moving coil device include: linearity (especially when combined with a feedback sensing layer as described hereinbefore); a much greater excursion possible from a given size and/or weight of motor assembly; much lower weight (no magnet and yoke assembly); a much higher efficiency (no lossy resistive voice coil); and a more compact assembly.

Finally, in both cases described, because the coiled-coil device does not require additional axial positioning for its operation (as does the coil in a moving-coil motor) it may be possible to completely dispense with the rear suspension of the cone.

FIG. 59 shows another application for the coiled-coil device of the invention, this time in the focussing and positioning of laser beams for, e.g., CD and DVD players, and for magnetic disc read/write head positioning in hard-disk (winchester) storage devices. The particular virtues of the device here include: high-speed actuation over a long travel; excellent linearity (especially when combined with a feedback sensing layer as described herein); low power operation; and the ability to hold a fixed position with almost zero power consumption; and light weight, compact form.

FIG. 59 shows an example of a lens positioning device 590 wherein a lens 591 is attached to one (free, axial) end of an electro-active device 592, co-axially with the device 592. The other (axial) end of the device 592 is fixed to a frame 593 movable radially of a disk 594 such as a CD or DVD. Activation of the device 592 by a static or dynamic voltage causes the free end of the device 592 carrying the lens 591 to move axially relative to the fixed end of the device 592 on the frame 593, taking the lens with it, thus allowing simple control of the lens position relative to the disk 594. A laser source 595 emits a beam 596 through the open centre of the device 592 to be focussed by the lens 591 onto the disk 594. Thus activation of the device 592 adjusts the focussing of the beam 596.

The low weight of this focussing device 590 lends itself well to the assembly itself being moved bodily by a second somewhat larger coiled-coil device (not shown) positioned so as to move the entire assembly radially with respect to the disc 594 that is to be read or written by the laser beam 596.

In a converse mode of operation, the electro-active device is mechanically activated. In this case, it may be used as a sensor to convert relative movement along the major axis into a signal on the electrodes of the electro-active device or similarly a generator to convert relative movement for example vibrational movement along the major axis into an alternating voltage on the electrodes of the electro-active device. This may be used for instance to charge a battery.

What is claimed is:

1. An electro-active device having an electro-active structure extending along a minor axis, the minor axis being curved with a total curvature of at least 30°, the electro-active structure comprising successive electro-active portions extending around said minor axis and arranged with electrodes to bend, when activated, around the minor axis such that bending of the successive portions is concomitant with rotation of the electro-active structure about the minor axis adding incrementally along the minor axis.

2. An electro-active device as claimed in claim 1, wherein the electro-active structure comprises a continuous electro-active member extending along and curving around the minor axis, such that successive finite portions of the continuous member constitute said successive electro-active portions.

3. An electro-active device as claimed in claim 2, wherein the continuous electro-active member is a tape.

4. An electro-active device as claimed in claim 2, wherein:
   the continuous electro-active member extends along the minor axis in a helix around the minor axis.

5. An electro-active device as claimed in claim 4, wherein the continuous electro-active member has layers oriented across the width of the member extending parallel to the minor axis.

6. An electro-active device as claimed in claim 2, wherein the continuous electro-active member has a shape which is twisted along the minor axis.

7. An electro-active device as claimed in claim 2, wherein the continuous electro-active member has electrodes in separate sections along the length of the minor axis.

8. An electro-active device as claimed in claim 2, wherein the electro-active structure comprises a plurality of intertwined continuous electro-active members each extending along and curving around the minor axis.

9. An electro-active device as claimed in claim 1, wherein electro-active structure comprises a plurality of discrete electro-active elements connected together to constitute said successive electro-active portions.

10. An electro-active device as claimed in claim 9, wherein successive electro-active elements along the minor axis extend in the same sense around the minor axis so that bending of the successive elements of electro-active material in the same sense around the minor axis is concomitant with said rotation.

11. An electro-active device as claimed in claim 9, wherein successive discrete electro-active elements along the minor axis extend in alternate senses around the minor axis so that bending of the successive elements of electro-active material in alternate senses around the minor axis is concomitant with said rotation.

12. An electro-active device as claimed in claim 9, wherein the plurality of discrete electro-active elements are separately formed and connected by separate connecting elements.

13. An electro-active device as claimed in claim 9, wherein the plurality of discrete electro-active elements are connected by connecting portions which, together with the plurality of discrete electro-active elements, are formed as a unitary member.

14. An electro-active device as claimed in claim 1, wherein the minor axis extends in a curve which is one of: a helix; a spiral; a series of at least two coaxial spirals; a series of at least two coaxial helices; a circle; or an arc of a circle.

15. An electro-active device as claimed in claim 1, wherein the minor axis curves in a curve consisting of straight portions between at least one bend.

16. An electro-active device as claimed in claim 1, wherein the minor axis is curved with a total curvature of at least 90°.

17. An electro-active device as claimed in claim 1, wherein the minor axis curves in an irregular curve.

18. An electro-active device as claimed in claim 1, wherein the minor axis curves in a curve which curves around a single major axis and subtends less than 360° at the major axis.

19. An electro-active device as claimed in claim 1, wherein:
the electro-active portions include piezoelectric material; and
the piezoelectric material is a piezoelectric ceramic or a piezoelectric polymer.

20. An electro-active device as claimed in claim 1, wherein:
the electro-active portions include piezoelectric material; and
the piezoelectric material is lead zirconate titanate (PZT) or polyvinylidenefluoride (PVDF).

21. An electro-active device as claimed in claim 1, wherein:
the successive electro-active portions have at least two layers of electro-active material to act as a bimorph or multimorph.

22. An electro-active device as claimed in claim 1, wherein:
the successive electro-active portions have a plurality of layers including at least one layer of electro-active material; and
a sensor layer with associated electrodes.

23. An electro-active device as claimed in claim 1, wherein:
along the length of the minor axis the electro-active structure has a variation to vary the degree of bending or the stiffness;
the variation being in at least one of: the width of the electro-active portions; the cross-section of the electro-active portions; the cross-section of one or more layers of the electro-active portions; the number of layers; or the composition of at least one layer.

24. An electro-active device as claimed in claim 1, wherein the electro-active structure is provided with external polymeric or elastomeric material.

25. An electro-active device as claimed in claim 2, wherein the continuous electro-active member extends along the minor axis in a curve having at least two turns around the minor axis.

26. An electro-active device as claimed in claim 2, wherein the continuous electro-active member has been formed by being wound around the minor axis.

27. An electro-active device as claimed claim 2, wherein the continuous electro-active member is formed with conductive electrodes extending continuously along the electro-active member.

28. An electro-active device having a continuous electro-active member extending along a minor axis, the minor axis being curved with a total curvature of at least 30°, the continuous electro-active member curving around the minor axis and arranged with electrodes to bend, when activated, around the minor axis such that bending of successive finite portions of the continuous electro-active member is concomitant with rotation of the electro-active member about the minor axis adding incrementally along the minor axis.

29. An electro-active device having an electro-active structure extending along a minor axis, the minor axis being curved with a total curvature of at least 30°, the electro-active structure comprising a plurality of discrete electro-active elements coupled together to extend around said minor axis and arranged with electrodes to bend, when activated, around the minor axis such that bending of the successive electro-active elements is concomitant with rotation of the electro-active structure about the minor axis adding incrementally along the minor axis.

30. An electro-active device having an electro-active structure extending along a minor axis, the minor axis extending in a curve with a total curvature of at least 30°, the electro-active structure comprising successive electro-active portions extending around said minor axis and arranged with electrodes to bend, when activated, around the minor axis, the successive electro-active portions being coupled together such that bending of the successive portions is concomitant with rotation of the electro-active structure about the minor axis adding incrementally along the minor axis, which rotation is concomitant with displacement of the structure out of the local plane of the curve of the minor axis.

31. An electro-active device as claimed in claim 30, wherein the electro-active structure comprises a continuous electro-active, member extending along and curving around the minor axis, such that successive finite portions of the continuous member constitute said successive electro-active portions.

32. A method of making an electro-active device comprising winding a deformable, continuous electro-active member into a structure as claimed in claim 28.

33. A method as claimed in claim 32, further comprising initially making the continuous electro-active member by extrusion, co-extrusion or calendering.

34. A method as claimed in claim 33, wherein said step of winding the continuous electro-active member comprises:
winding the continuous electro-active member into a curve around a minor axis; and
curving the wound continuous electro-active member.

35. A method as claimed in claim 33, wherein said step of winding the continuous electro-active member comprises flat-winding the continuous electro-active member around a minor former.

36. A method as claimed in claim 35, wherein:
said minor former is straight and deformable; and
said step of curving the minor curve of the continuous electro-active member comprises curving the minor former and the continuous electro-active member.

37. A method as claimed in claim 33, further comprising setting the electro-active member.

38. A method as claimed in claim 37, wherein:
the deformable, continuous electro-active member is a sinterable plasticised ceramic mixture; and
said step of setting the electro-active member comprises burning out the plasticising materials and densifying the resultant material through sintering.

39. A method of making an electro-active device comprising connecting together a plurality of separate electro-active elements by connecting elements to form a structure as claimed in claim 29.

40. A method of making an electro-active device comprising:
cutting an elongate electro-active member to form discrete electro-active elements positioned longitudinally along the elongate member and connected by connecting portions;
curving the elongate electro-active member extending longitudinally along the elongate member; and
curving the curved elongate electro-active member around the major axis to form a structure as defined in claim 13.

41. A method of converting an electrical signal into relative displacement comprising using an electro-active device as claimed in claim 1 as a driver to convert a signal applied to the electrodes of the electro-active device into relative displacement.

42. A method of converting displacement into an electrical signal comprising using of an electro-active device as claimed in claim 1 as a sensor to convert relative displacement into a signal on the electrodes of the electro-active device.

43. A lens positioning device comprising an electro-active device as claimed in claim 1 mounting a lens for movement of the lens by activation of the electro-active device.

44. A positioning device comprising:
a support;
an object to be positioned;
a plurality of electro-active devices each as claimed in claim 1 and being connected to the support and the object to be positioned.

45. An electro-active device according to claim 1, wherein the successive electro-active portions have a plurality of layers including at least one layer of electro-active material.

46. An electro-active device as claimed in claim 28, wherein the continuous electro-active member is a tape.

47. An electro-active device as claimed in claim 28, wherein the continuous electro-active member extends along the minor axis in a helix around the minor axis.

48. An electro-active device as claimed in claim 28, wherein the continuous electro-active member has layers oriented across the width of the member extending parallel to the minor axis.

49. An electro-active device as claimed in claim 28, wherein the continuous electro-active member has a shape which is twisted along the minor axis.

50. An electro-active device as claimed in claim 28, wherein the continuous electro-active member has electrodes in separate sections along the length of the minor axis.

51. An electro-active device as claimed in claim 28, wherein the electro-active structure comprises a plurality of inter-twined continuous electro-active members each extending along and curving around the minor axis.

52. An electro-active device as claimed in claim 28, wherein the minor axis curves in a curve consisting of straight portions between at least one bend.

53. An electro-active device as claimed in claim 28, wherein the minor axis is curved with a total curvature of at least 90°.

54. An electro-active device as claimed in claim 28, wherein the minor axis curves in an irregular curve.

55. A electro-active device as claimed in claim 28, wherein the minor axis curves in a curve which curves around a single major axis and subtends less than 360° at the major axis.

56. An electro-active device as claimed in claim 28, wherein the minor axis extends in a curve which is one of: a helix; a spiral; a series of at least two coaxial spirals; a series of at least two coaxial helices; a circle; or an arc of a circle.

57. An electro-active device as claimed in claim 28, wherein the electro-active member includes piezoelectric material, the piezoelectric material being a piezoelectric ceramic or a piezoelectric polymer.

58. An electro-active device as claimed in claim 28, wherein the electro-active member includes piezoelectric material, the piezoelectric material being lead zirconate titanate (PZT) or polyvinylidenefluoride (PVDF).

59. An electro-active device as claimed claim 28, wherein the electro-active member has a plurality of layers including at least one layer of electro-active material.

60. An electro-active device as claimed in claim 28, wherein the electro-active member has at least two layers of electro-active material to act as a bimorph or multimorph.

61. An electro-active device as claimed in claim 28, wherein the electro-active member has a plurality of layers including at least one layer of electro-active material and a sensor layer with associated electrodes.

62. An electro-active device as claimed in claim 28, wherein along the length of the minor axis the electro-active member has a variation to vary the degree of bending or the stiffness, the variation being in at least one of: the width of the electro-active member; the cross-section of the electro-active member; the cross-section of one or more layers of the electro-active member; the number of layers of the electro-active member; or the composition of at least one layer of the electro-active member.

63. An electro-active device as claimed in claim 28, wherein the electro-active structure is provided, with external polymeric or elastomeric material.

64. An electro-active device as claimed in claim 28, wherein the continuous electro-active member extends along the minor axis in a curve having at least two turns around the minor axis.

65. An electro-active device as claimed in claim 28, wherein the continuous electro-active member has been formed by being wound around the minor axis.

66. An electro-active device as claimed claim 28, wherein the continuous electro-active member is formed with conductive electrodes extending continuously along the electro-active member.

67. An electro-active device as claimed in claim 29, wherein successive electro-active elements along the minor axis extend in the same sense around the minor axis so that bending of the successive elements of electro-active material in the same sense around the minor axis is concomitant with said rotation.

68. An electro-active device as claimed in claim 29, wherein successive discrete electro-active elements along the minor axis extend in alternate senses around the minor axis so that bending of the successive elements of electro-active material in alternate senses around the minor axis is concomitant with said rotation.

69. An electro-active device as claimed in claim 29, wherein the plurality of discrete electro-active elements are separately formed and connected by separate connecting elements.

70. An electro-active device as claimed in claim 29, wherein the plurality of discrete electro-active elements are connected by connecting portions which, together with the plurality of discrete electro-active elements, are formed as a unitary member.

* * * * *